(12) United States Patent
King et al.

(10) Patent No.: US 8,159,222 B2
(45) Date of Patent: Apr. 17, 2012

(54) METHOD FOR RADIO-FREQUENCY NUCLEAR MAGNETIC RESONANCE IMAGING

(75) Inventors: Scott King, Winnipeg (CA); Jonathan Sharp, Calgary (CA)

(73) Assignee: National Research Council of Canada, Ottawa, ON ( * ) Notice: Subject to any disclaimer, the term of this patent is extended or adjusted under 35 U.S.C. 154(b) by 385 days.

(21) Appl. No.: 12/449,822

(22) PCT Filed: May 2, 2008

(86) PCT No.: PCT/CA2008/000868
§ 371 (c)(1),
(2), (4) Date: Aug. 28, 2009

(87) PCT Pub. No.: WO2008/134892
PCT Pub. Date: Nov. 13, 2008

(65) Prior Publication Data
US 2010/0026299 A1     Feb. 4, 2010

Related U.S. Application Data

(60) Provisional application No. 60/924,195, filed on May 3, 2007.

(51) Int. Cl.
*G01V 3/14* (2006.01)
*A61B 5/05* (2006.01)
(52) U.S. Cl. ......... 324/309; 324/307; 324/314; 600/407
(58) Field of Classification Search .......... 324/300–322; 600/407
See application file for complete search history.

(56) References Cited

U.S. PATENT DOCUMENTS 6,031,375 A    2/2000    Atalar et al.
6,879,158 B2   4/2005    Zhu
7,141,973 B2   11/2006   King et al.
(Continued)

FOREIGN PATENT DOCUMENTS

EP         1 852 710 A2    7/2007
(Continued)

OTHER PUBLICATIONS

Bendall et al.; "Depth and Refocusing Pulses Designed for Multipulse NMR with Surface Coils"; J. of Magnetic Resonance; vol. 53; p. 365-385; 1983.
(Continued)

*Primary Examiner* — Melissa Koval
*Assistant Examiner* — Emily Chan
(74) *Attorney, Agent, or Firm* — Jason E. J. Davis

(57) ABSTRACT

Accumulated spin magnetization phase within a RF MRI procedure can be used for providing an orderly k-space traversal. By operating a transmit array adapted to produce two B1 fields in alternation, where the B1 fields are substantially uniform in amplitude over a sample volume of the MRI setup, and the B1 fields have respective spatial phase distributions such that selection of a difference in spatial derivatives of the spatial phase distributions permits control over a size of a step in k-space applied by successive refocusing pulses for generating the B1 fields in alternation. Each alternating refocusing pulse issued within a T2 time causes a step through k-space in an encoding direction determined by the difference in spatial derivatives.

22 Claims, 40 Drawing Sheets

U.S. PATENT DOCUMENTS

| | | | |
|---|---|---|---|
| 7,180,291 B2 | 2/2007 | Chmielewski et al. | |
| 7,479,782 B2* | 1/2009 | Van Den Brink | 324/307 |
| 7,693,569 B1* | 4/2010 | Brittain et al. | 600/413 |
| 2005/0231203 A1* | 10/2005 | Feiweier et al. | 324/320 |
| 2008/0061779 A1* | 3/2008 | Feiweier | 324/307 |

FOREIGN PATENT DOCUMENTS

| | | |
|---|---|---|
| WO | WO 2005/012931 | 10/2005 |

OTHER PUBLICATIONS

Duensing et al.; "N-Dimensional Orthogonality of Volume Coil Arrays"; Proc. Intl. Soc. Mag. Reson. Med.; vol. 10; 2002.

Garwood et al.; "Spatial Localization of Tissue Metabolites by Phosphorus-31 NMR Rotating-Frame Zeugmatography"; J. of Magnetic Resonance; vol. 60; p. 268-279; 1984.

Humbert et al.; "NMR Microscopy by Strong Radiofrequency-Field Gradients with Spatial Resolution Better than Five Micrometers"; J. of Magnetic Resonance series A; vol. 123; p. 242-245; 1996.

King et al.; Phase Encoding Without Gradients Using TRASE-FSE MRI; Proc. Intl. Soc. Mag. Reson. Med.; vol. 15; p. 680; 2007.

King et al., "Transmit Array Spatial Encoding (TRASE): A New Data Acquisition Method in MRI"; Proc. Intl. Soc. Mag. Reson. Med.; vol. 14; p. 2628; 2006.

Maffei et al.; "NMR Microscopy by Radiofrequency Field Gradients"; J. of Magnetic Resonance series A; vol. 107; p. 40-49; 1994.

* cited by examiner

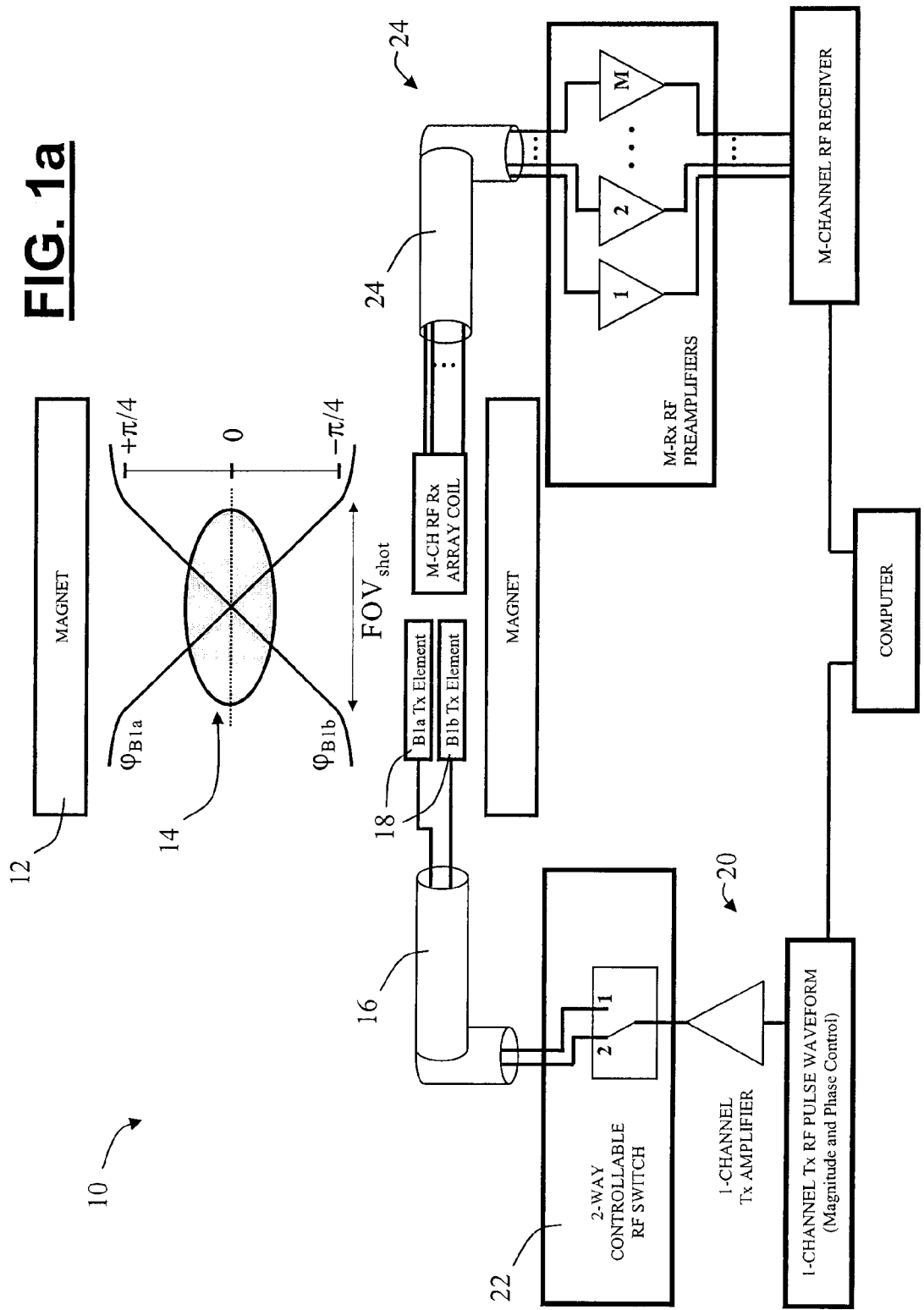

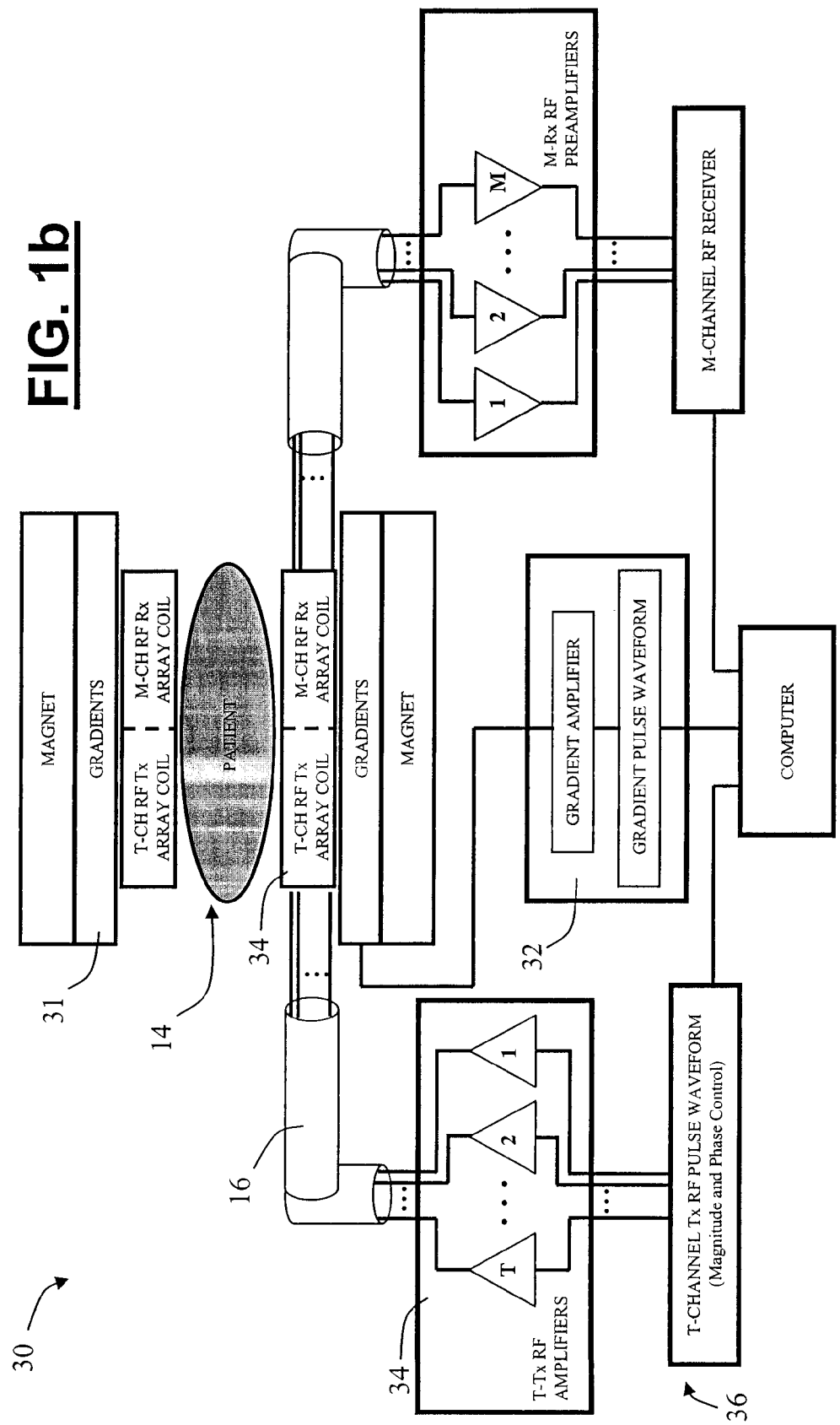

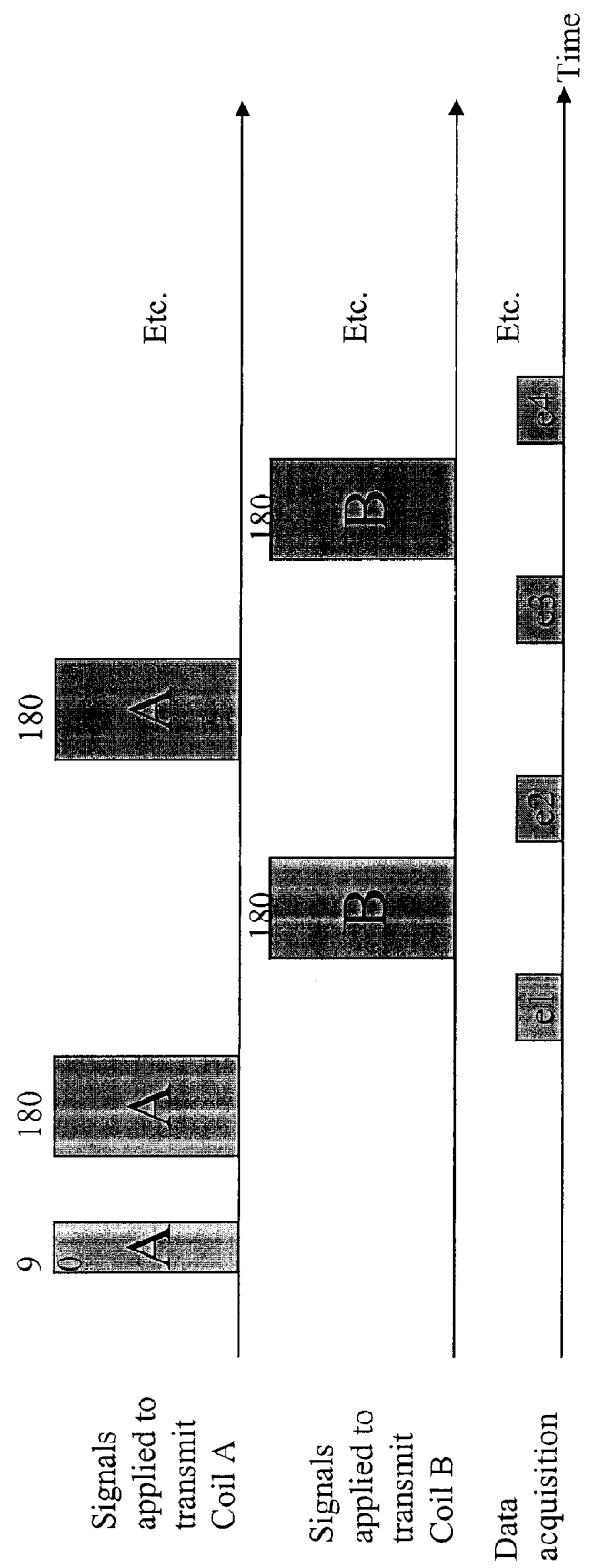

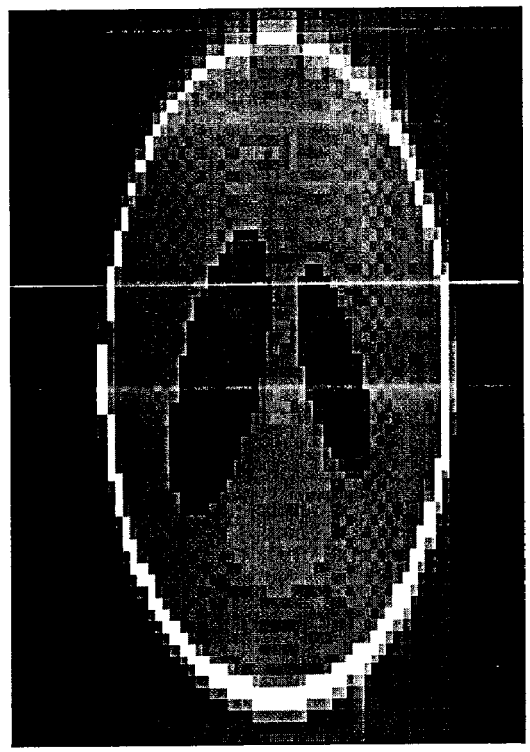
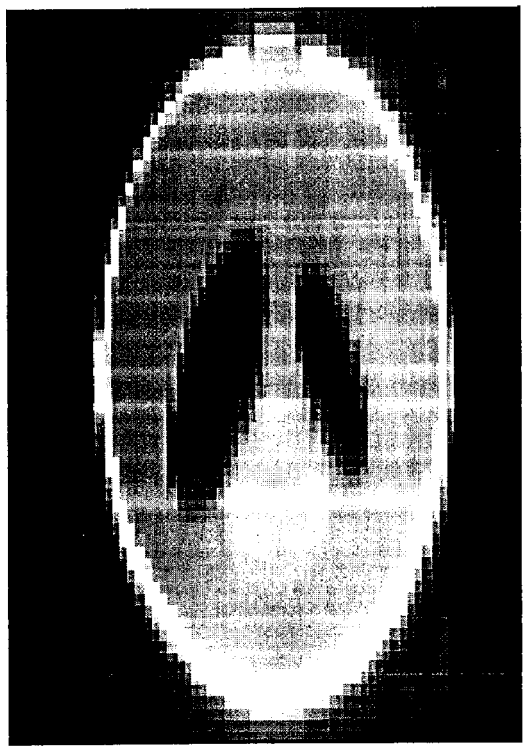
FIG. 3

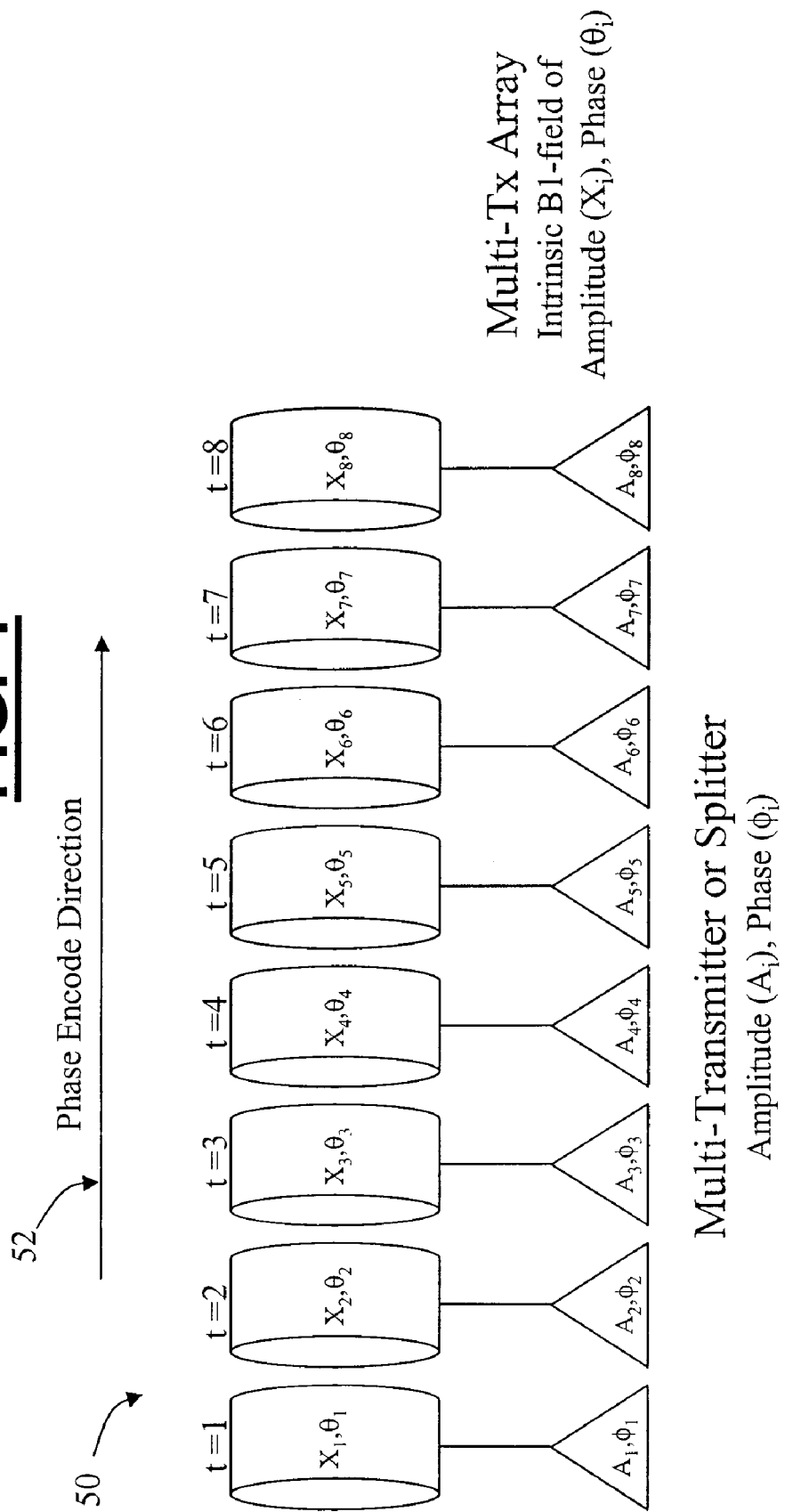

FIG. 5b
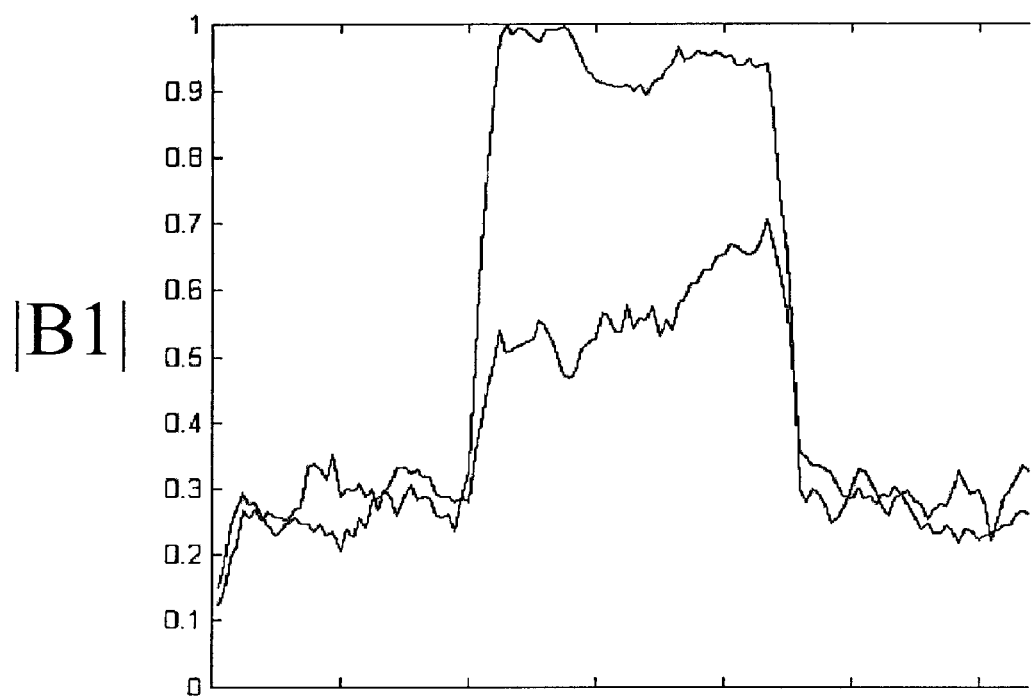
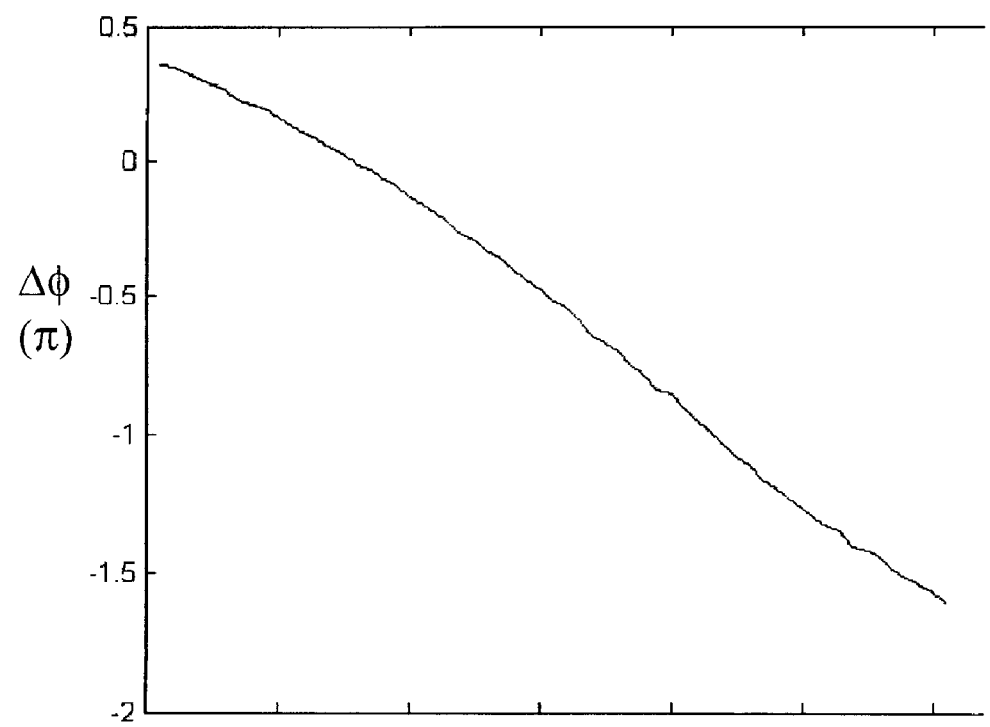

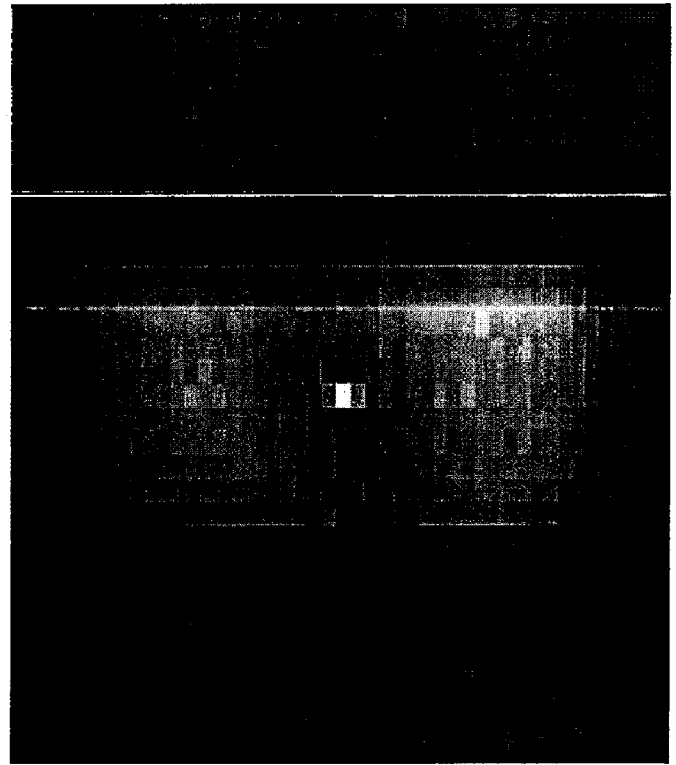
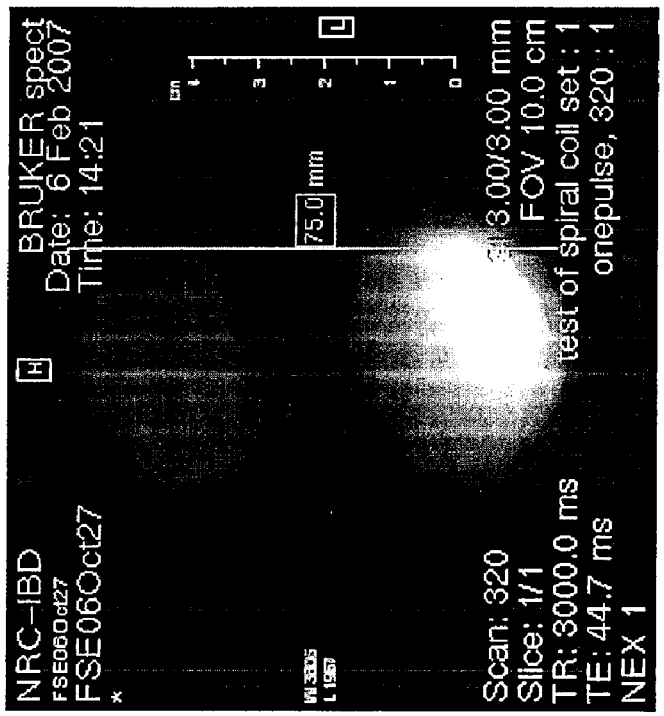
FIG. 5c

FIG. 5e
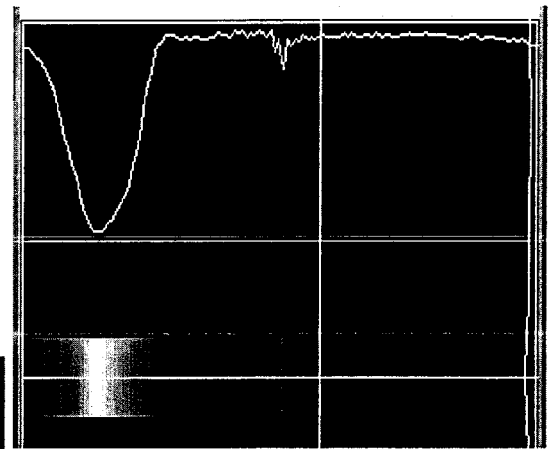
0.5cm
Scan #11
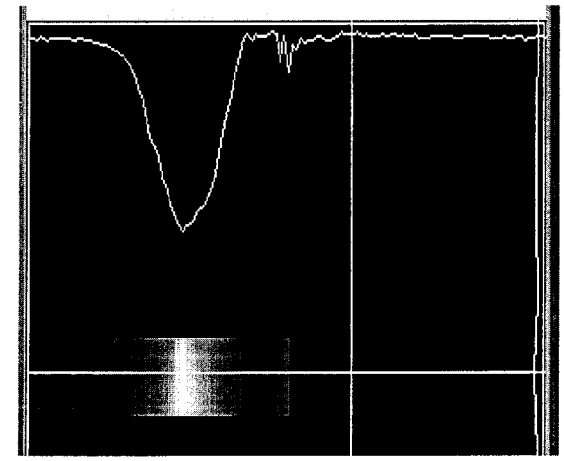
1.5cm
Scan #10
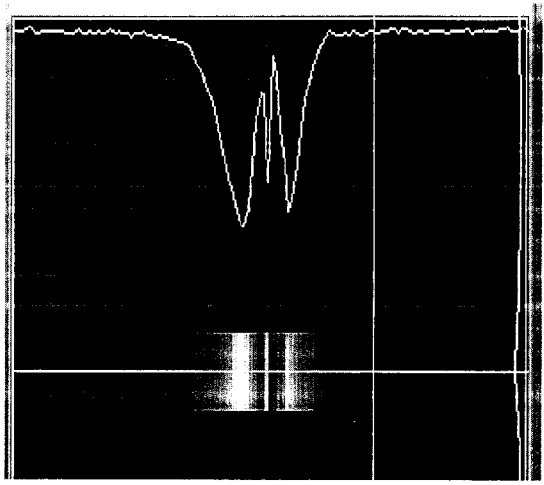
2.5cm
Scan #9
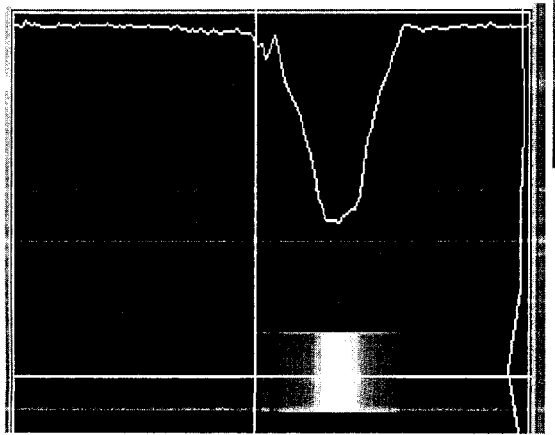
3.5cm
Scan #8

FIG. 5f
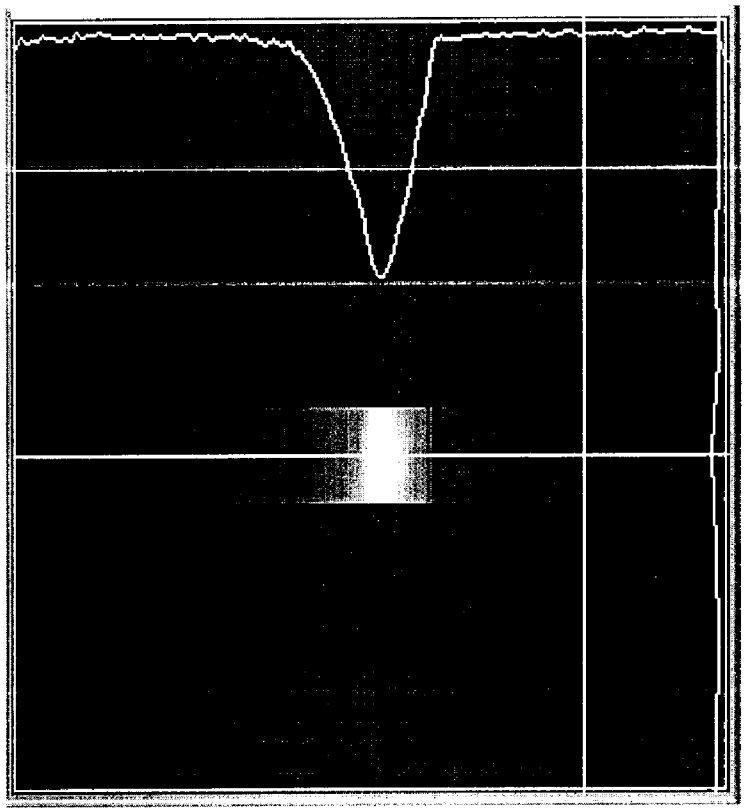
Scan #22
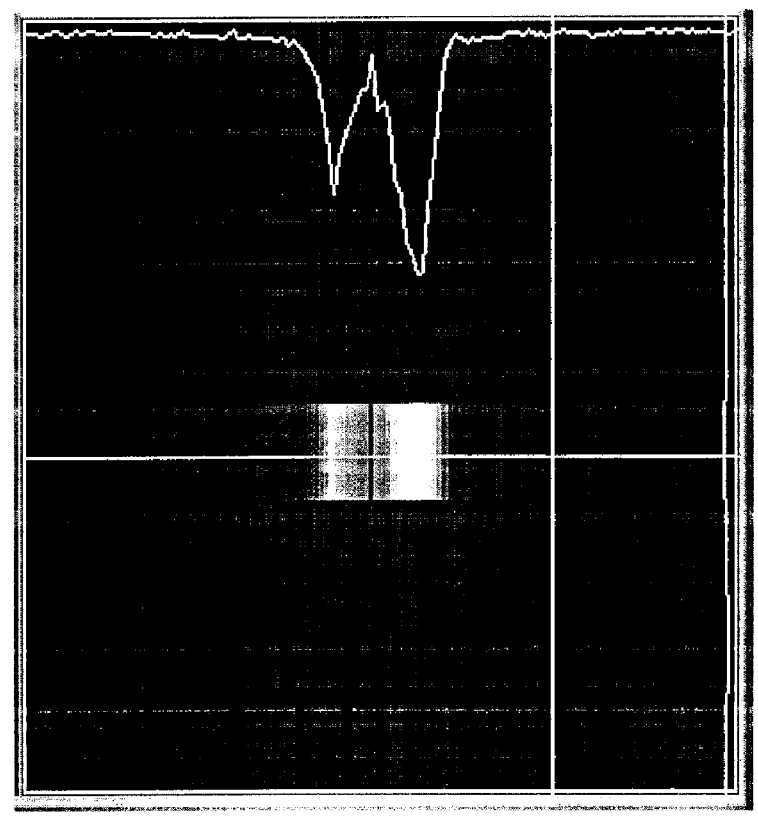
Scan #19

FIG. 5g
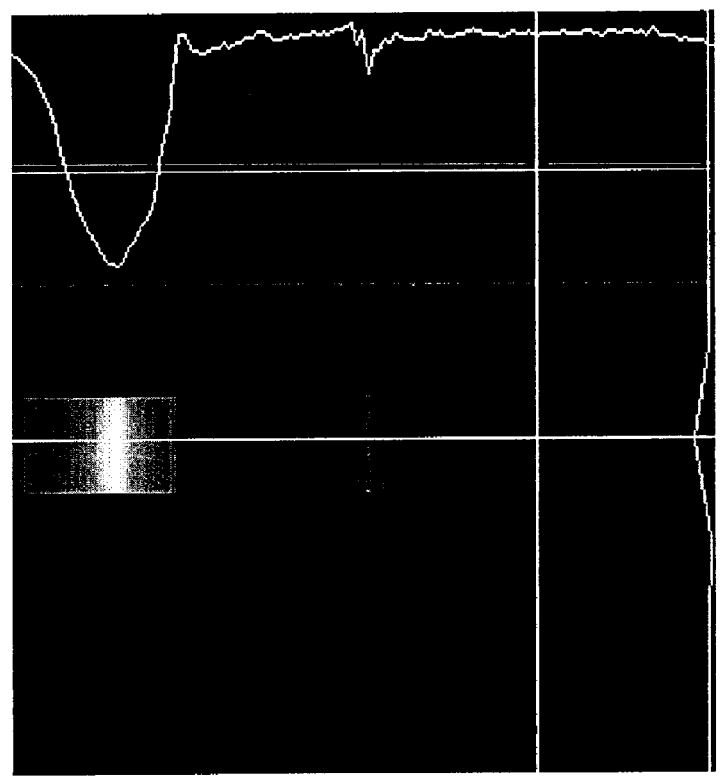
150 degree
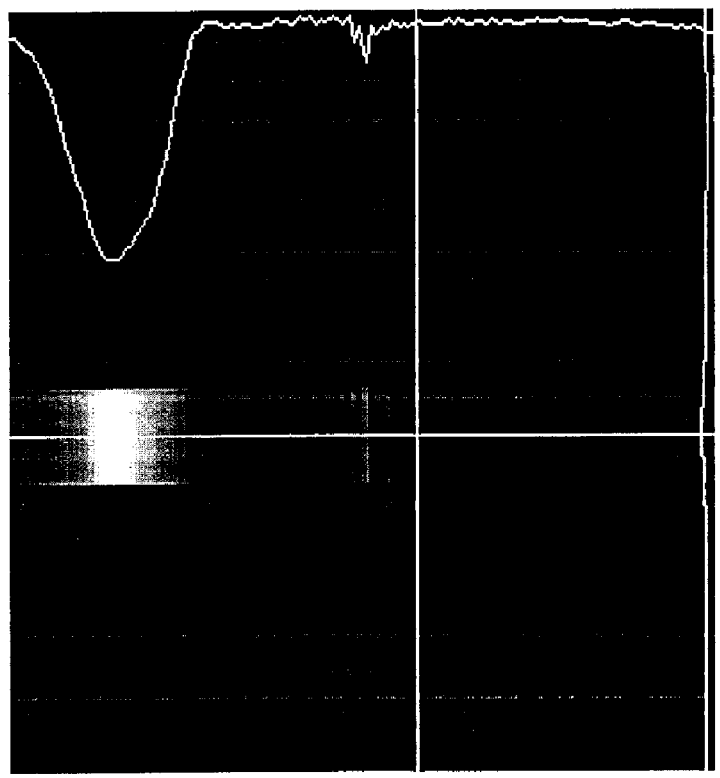
180 degree

FIG. 5h
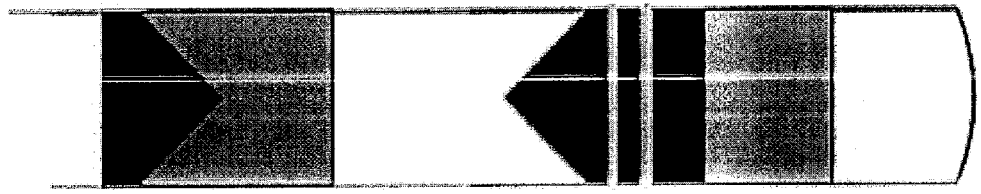
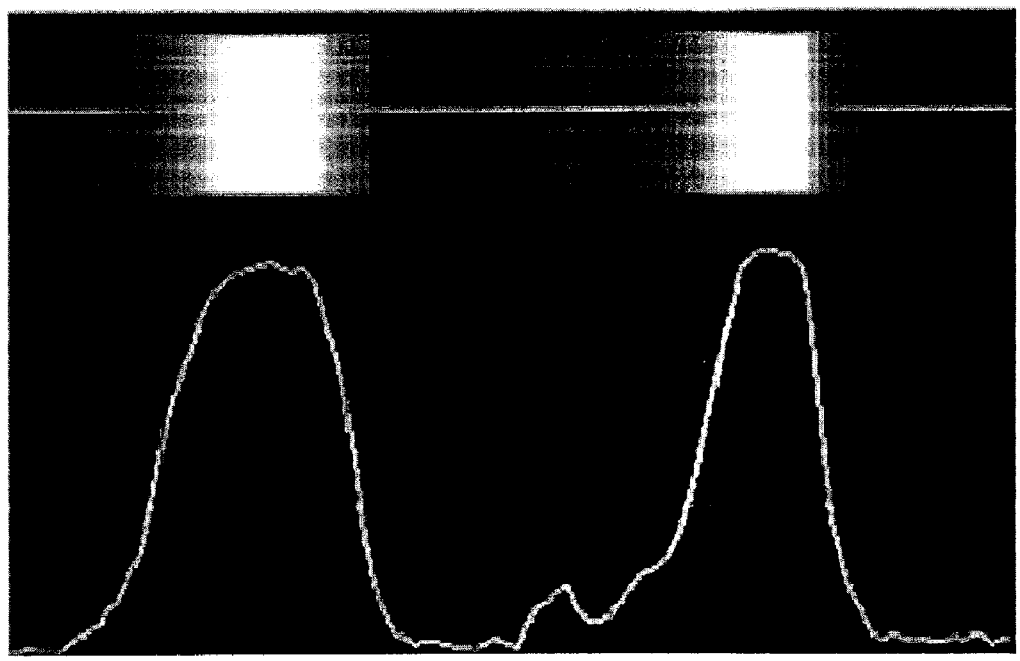

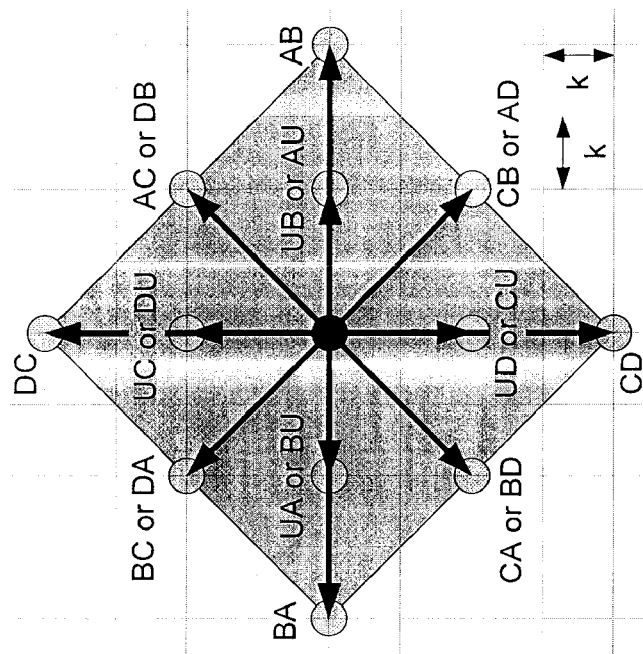
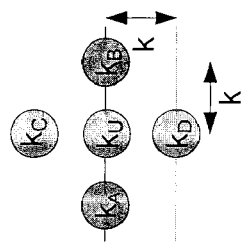
FIG. 6c
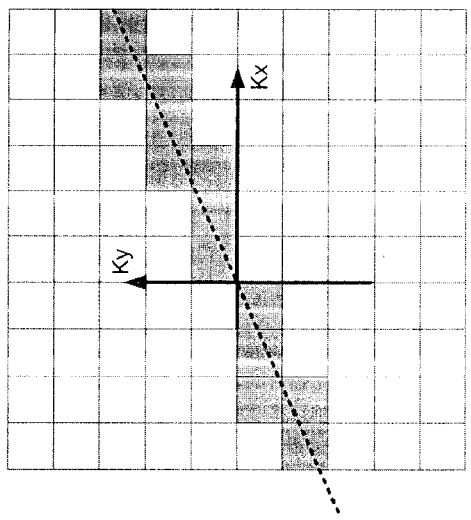
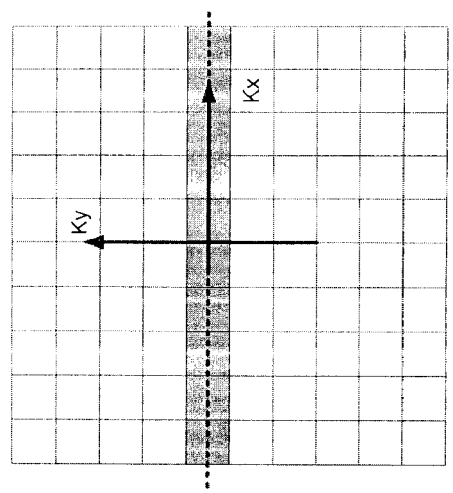
FIG. 6b

FIG. 6d
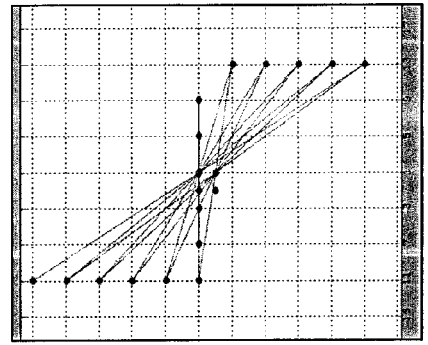
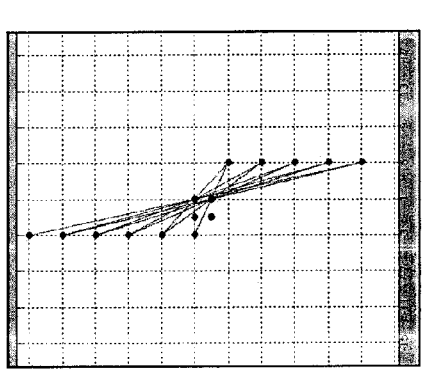
C-AB(5) and C-BA(5)
2nd Pair of Lines
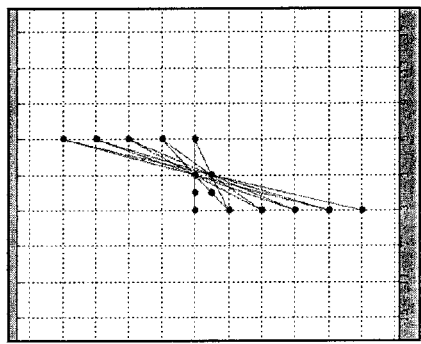
1st Vertical Line AB(5)
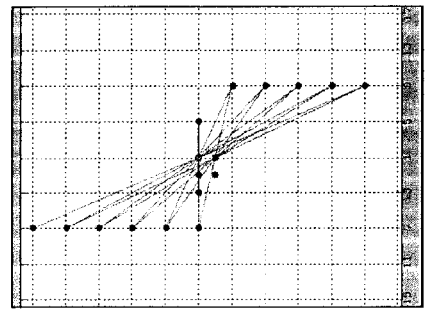
C-AC(2)-AB(5) and C-AC(2)-BA(5)
4th Pair of Lines
C-AC-AB(5) and C-AC-BA(5)
3rd Pair of Lines
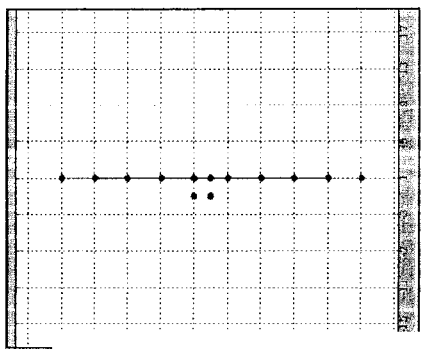

FIG. 6f

| | Encoding Direction(s) | Pair | | | | Examples |
|---|---|---|---|---|---|---|
| 1D Line | 1st (A-B) | | - | - | AB(n) | AB-AB |
| 1D Line | 2nd (A-C) | | | | AC(n) | |
| 1D Line | 3rd (A-D) | | | | AD(n) | |
| | | | | | | |
| 2D Plane | 1st (A-B) & 2nd (A-C) | Central | - | - | AB(n) | Transverse |
| | | 1st | C | - | AB(n) | C-AB-AB |
| | | 1st | C | - | BA(n) | |
| | | 2nd | C | AC(1) | AB(n) | |
| | | 2nd | C | AC(1) | BA(n) | |
| | | 3rd | C | AC(2) | AB(n) | |
| | | 3rd | C | AC(2) | BA(n) | |
| | | mth pair | C | AC(m-1) | AB(n) | |
| | | mth pair | C | AC(m-1) | BA(n) | |
| | | | | | | |
| 2D Plane | 1st (A-B) & 3rd (A-D) | Central | - | - | AB(n) | Sagittal |
| | | 1st | D | - | AB(n) | |
| | | 1st | D | - | BA(n) | |
| | | 2nd | D | AD(1) | AB(n) | D-AD-AB-AB |
| | | 2nd | D | AD(1) | BA(n) | |
| | | 3rd | D | AD(2) | AB(n) | |
| | | 3rd | D | AD(2) | BA(n) | |
| | | mth pair | D | AD(m-1) | AB(n) | |
| | | mth pair | D | AD(m-1) | BA(n) | |
| | | | | | | |
| 2D Plane | 2nd (A-C) & 3rd (A-D) | Central | - | - | AC(n) | Coronal |
| | | 1st | D | - | AC(n) | |
| | | 1st | D | - | CA(n) | |
| | | 2nd | D | AD(1) | AC(n) | |
| | | 2nd | D | AD(1) | CA(n) | |
| | | 3rd | D | AD(2) | AC(n) | |
| | | 3rd | D | AD(2) | CA(n) | |
| | | mth pair | D | AD(m-1) | AC(n) | |
| | | mth pair | D | AD(m-1) | CA(n) | |

FIG. 6g

To fill out planes in a 3rd dimension first move along the axis, then traverse a plane that is transverse to the direction moved. Coordinates: (n x m x p)

| | | move 1D Line 3rd (A-D) | plane | | |
|---|---|---|---|---|---|
| 2D Plane | 1st (A-B) & 2nd (A-C) Central | - | - | - | Transverse |
| | 1st | - | - | AB(n) | |
| | 1st | - | - | AB(n) | |
| | 2nd | - | C | BA(n) | |
| | 2nd | - | C | AB(n) | C-AC-AB-AB |
| | 3rd | - | C | AC(1) | BA(n) | |
| | 3rd | - | C | AC(1) | AB(n) | |
| | mth pair | - | C | AC(2) | BA(n) | |
| | mth pair | - | C | AC(m-1) | AB(n) | |
| | | - | C | AC(m-1) | BA(n) | |

This will cover parts to two planes however, so the other parts can be obtained by modifying the starting position and repeating

| | | move 1D Line 3rd (A-D) | plane | | |
|---|---|---|---|---|---|
| 2D Plane | 1st (A-B) & 2nd (A-C) Central | D | - | - | Transverse |
| | 1st | D | C | - | AB(n) | |
| | 1st | D | C | - | AB(n) | |
| | 2nd | D | C | - | BA(n) | |
| | 2nd | D | C | AC(1) | AB(n) | |
| | 3rd | D | C | AC(1) | BA(n) | D-C-AC-BA-BA |
| | 3rd | D | C | AC(2) | AB(n) | |
| | mth pair | D | C | AC(2) | BA(n) | |
| | mth pair | D | C | AC(m-1) | AB(n) | |
| | | D | C | AC(m-1) | BA(n) | |

FIG. 6h

| 2D Plane | 1st (A-B) & 2nd (A-C) | Central | DA | - | - | AB(n) | Transverse |
|---|---|---|---|---|---|---|---|
| | | 1st | DA | C | - | AB(n) | |
| | | 1st | DA | C | - | BA(n) | |
| | | 2nd | DA | C | AC(1) | AB(n) | |
| | | 2nd | DA | C | AC(1) | BA(n) | DA-C-AC-BA-BA |
| | | 3rd | DA | C | AC(2) | AB(n) | |
| | | 3rd | DA | C | AC(2) | BA(n) | |
| | | mth pair | DA | C | AC(m-1) | AB(n) | |
| | | mth pair | DA | C | AC(m-1) | BA(n) | |
| 2D Plane | 1st (A-B) & 2nd (A-C) | Central | DAD | - | - | AB(n) | |
| | | 1st | DAD | C | - | AB(n) | |
| | | 1st | DAD | C | - | BA(n) | |
| | | 2nd | DAD | C | AC(1) | AB(n) | |
| | | 2nd | DAD | C | AC(1) | BA(n) | |
| | | 3rd | DAD | C | AC(2) | AB(n) | |
| | | 3rd | DAD | C | AC(2) | BA(n) | |
| | | mth pair | DAD | C | AC(m-1) | AB(n) | |
| | | mth pair | DAD | C | AC(m-1) | BA(n) | |

FIG. 7a
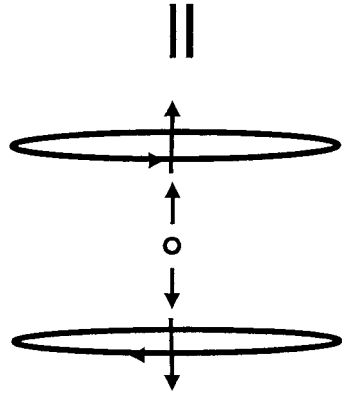
A: Helmholtz (co-rotating current) pair
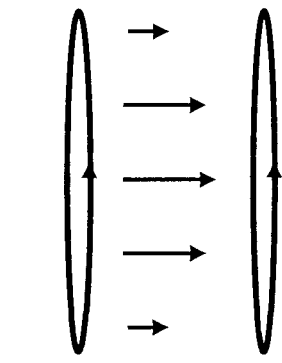
A: Helmholtz (co-rotating current) pair
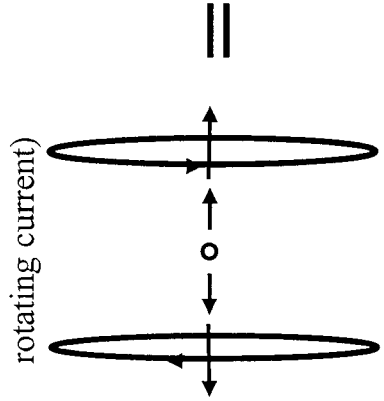
B: Maxwell (counter-rotating current) pair
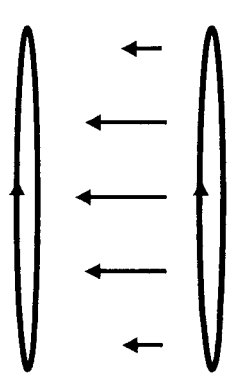
B: Maxwell (counter-rotating current) pair
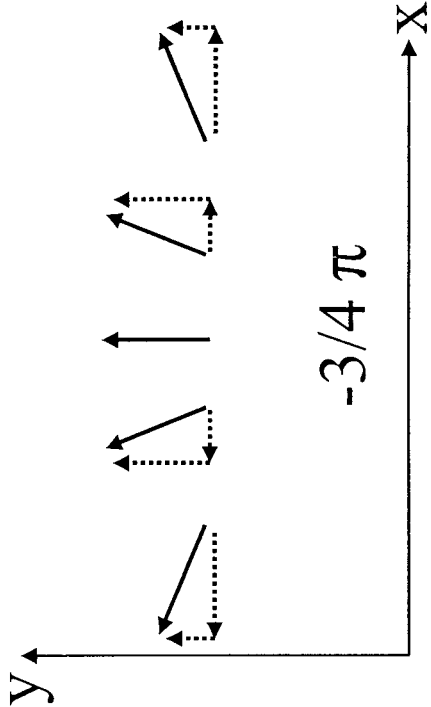
x-direction phase encoding
$+3/4\pi$
$-3/4\pi$

FIG. 7b
y-direction phase encoding
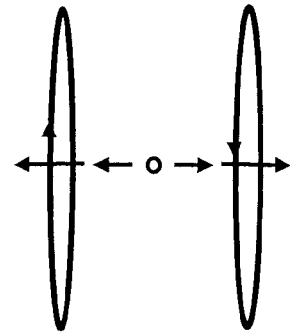
A: Helmholtz (co-rotating current) pair
+
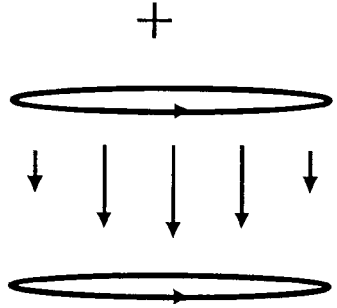
A: Helmholtz (co-rotating current) pair
+
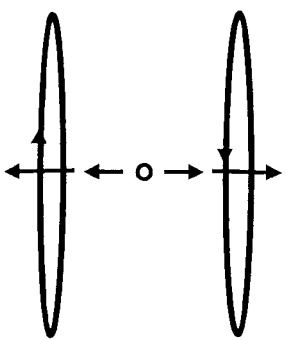
B: Maxwell (counter-rotating current) pair
+
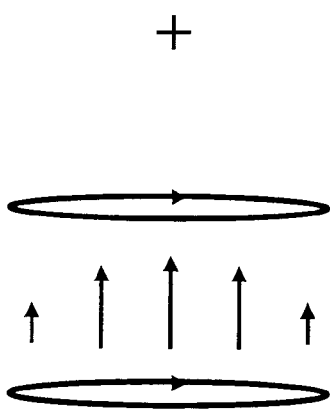
B: Maxwell (counter-rotating current) pair
=
=
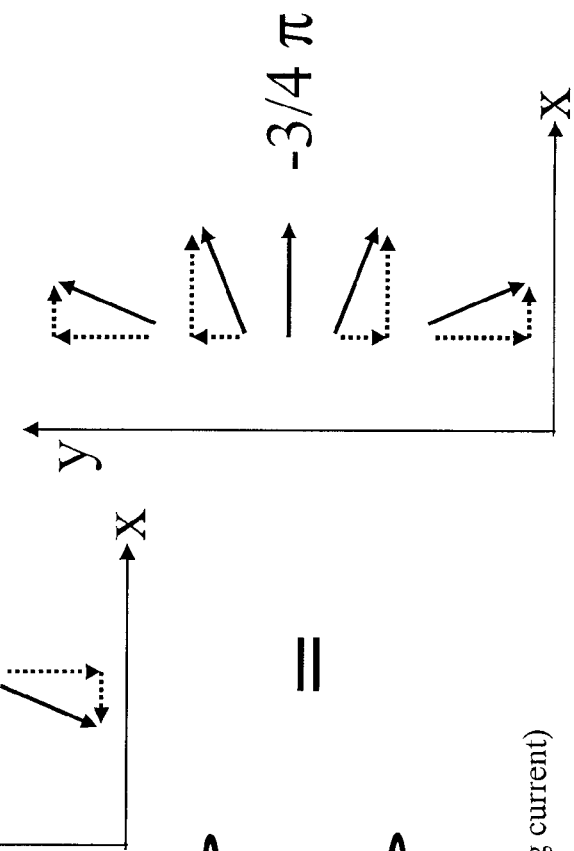
+3/4 π
−3/4 π

+2pi and −2pi Spiral birdcage array elements 3-turn, Co-rotating (Helmholz) coil pair 1-turn, Counter-rotating (Maxwell) coil pair

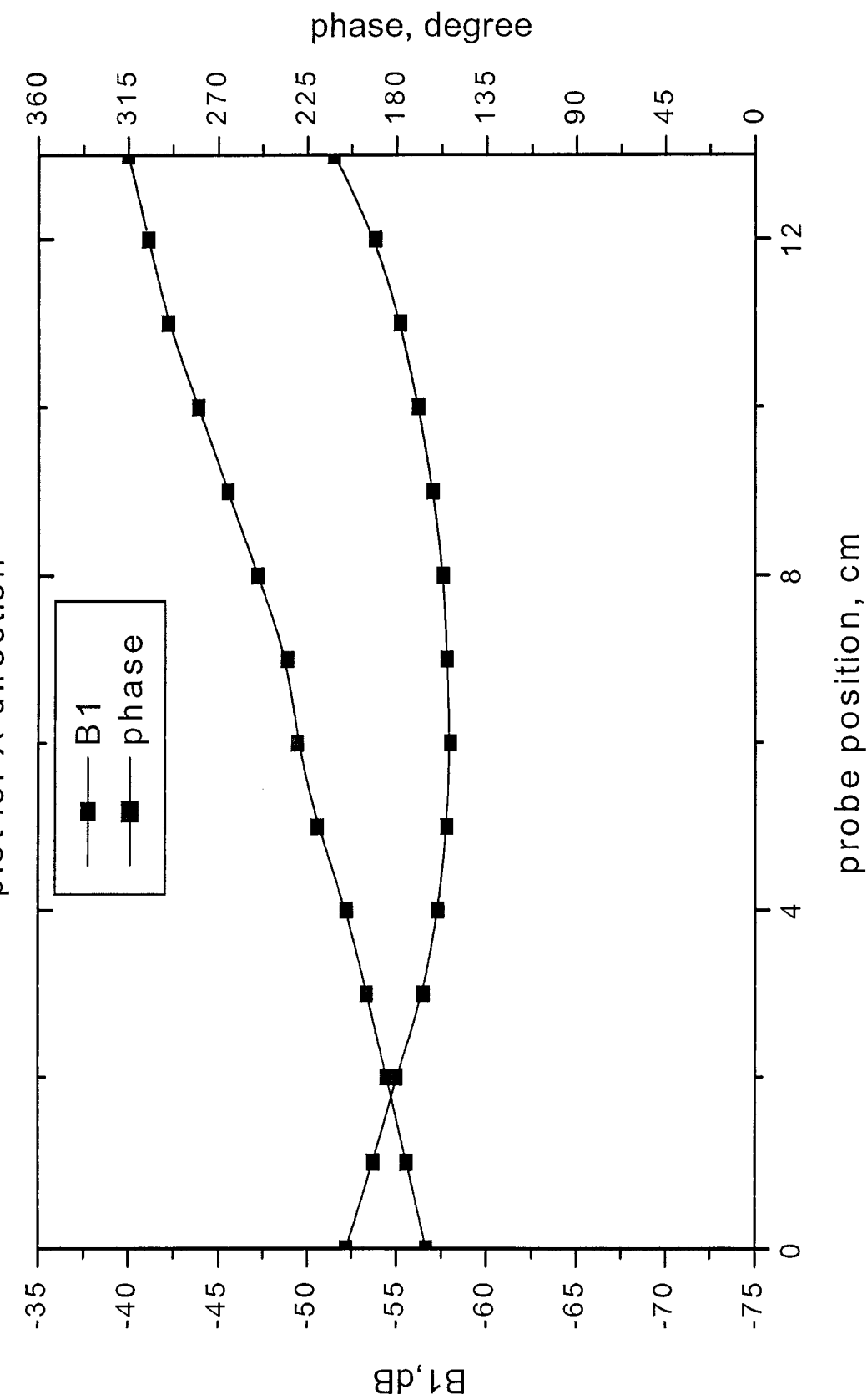

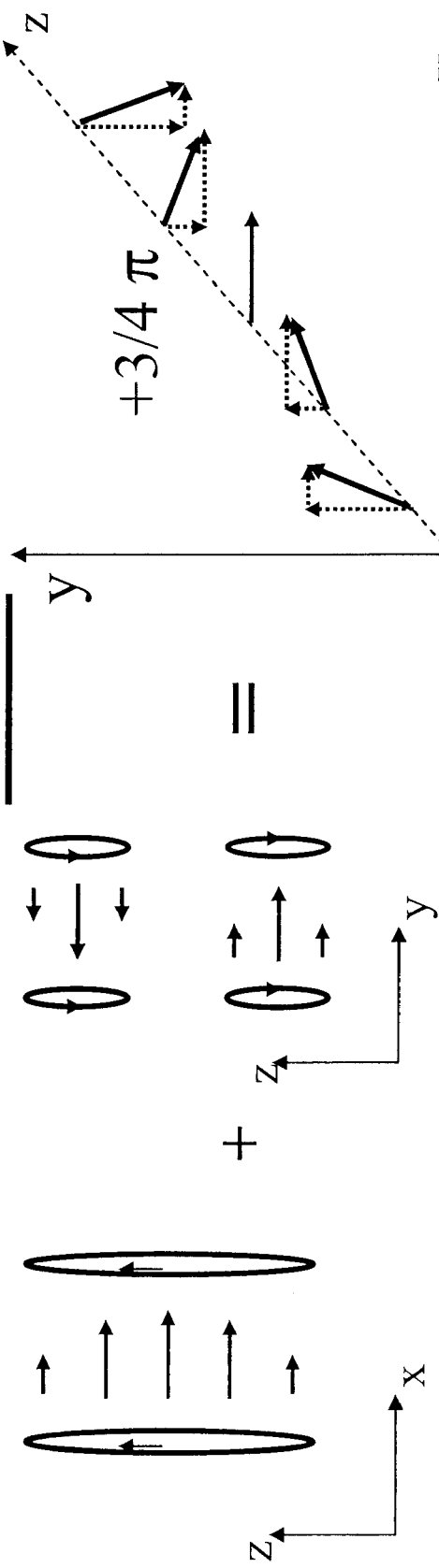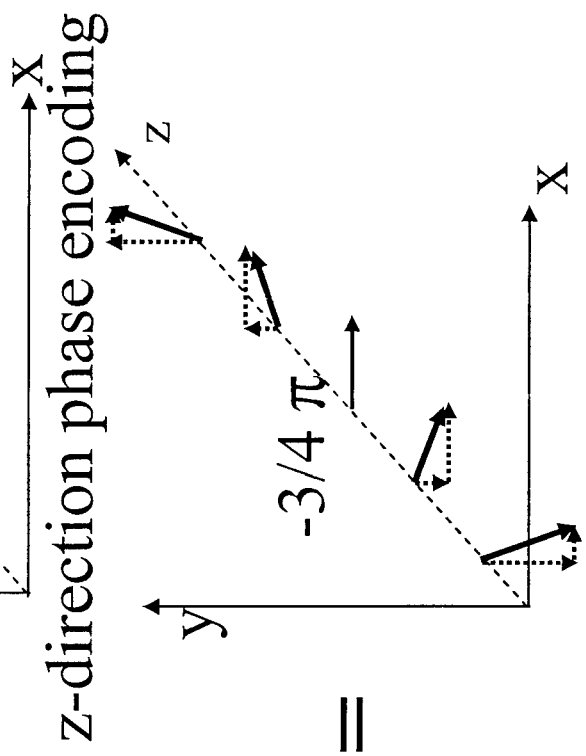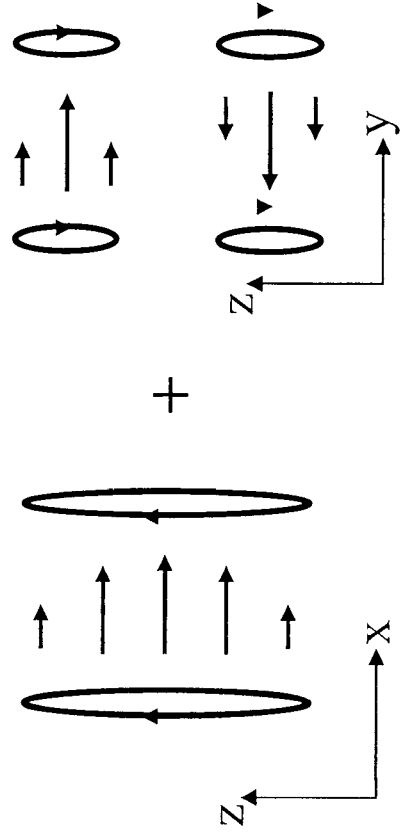
FIG. 8a

FIG. 8b
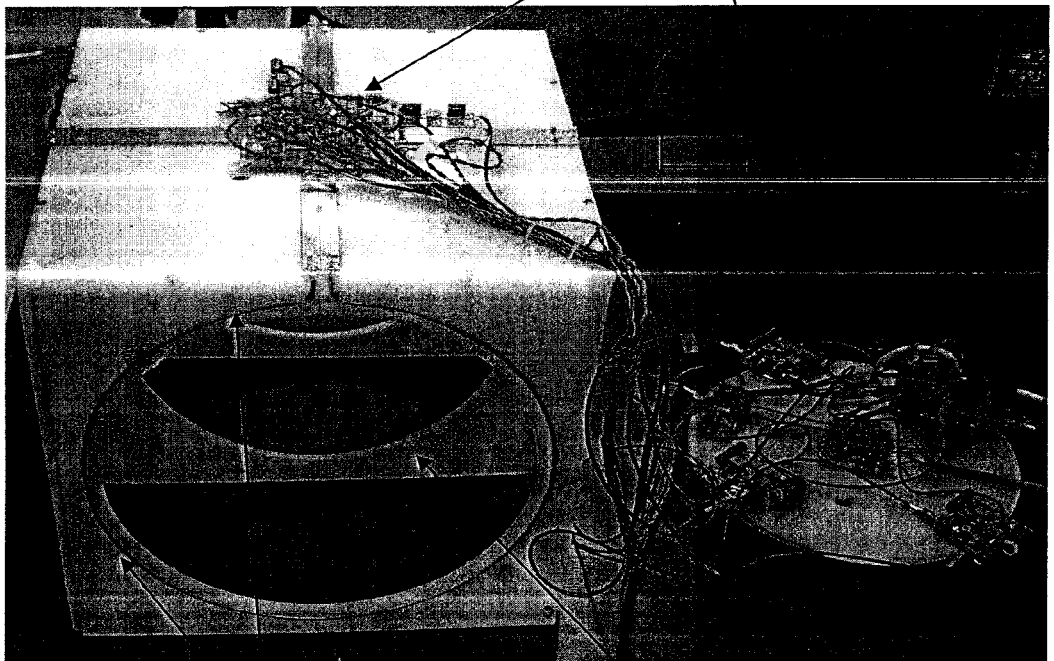
Phase gradient switching electronics
Two loops for Helmholtz or Maxwell fields
Third central loop for Uniform field
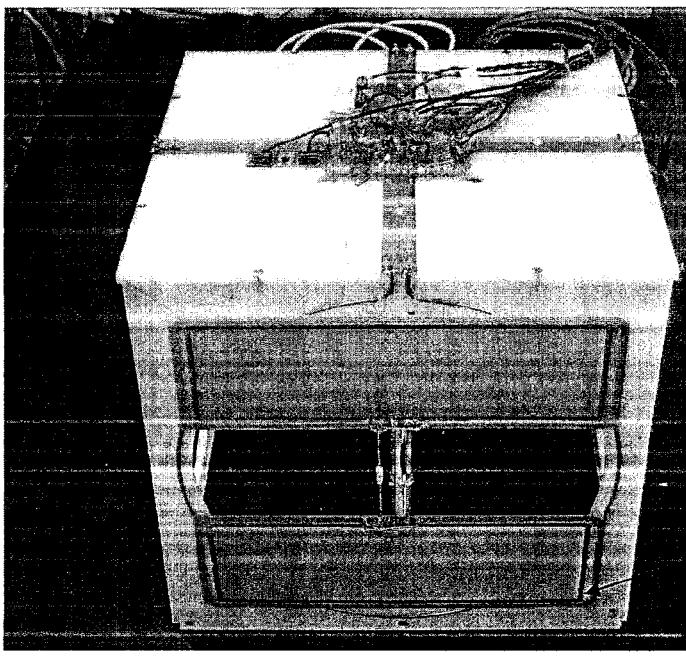
Two-turn small opposed Helmholtz for z-directed (B0-direction) phase gradient
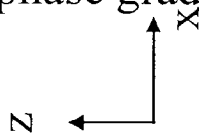

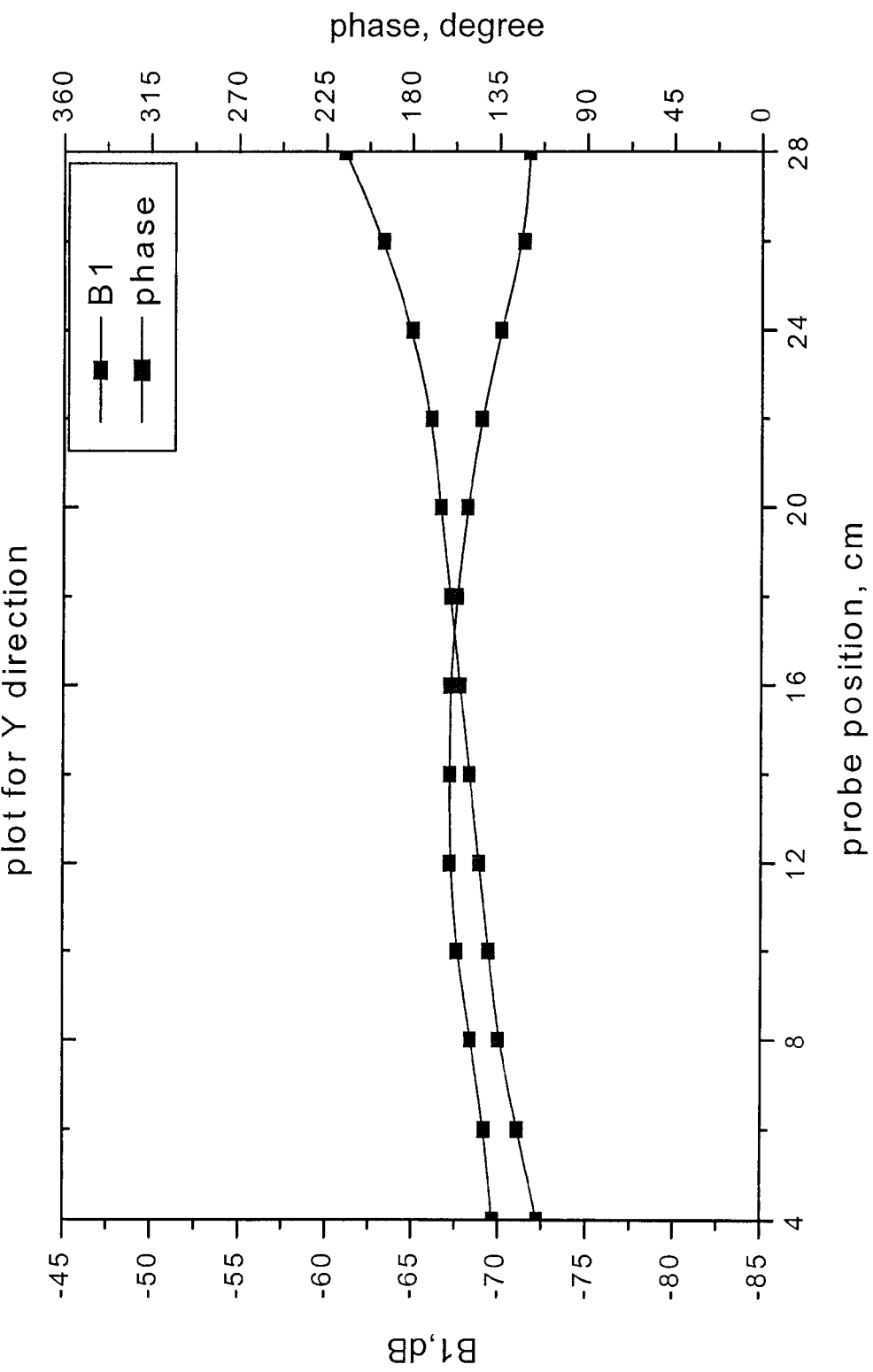

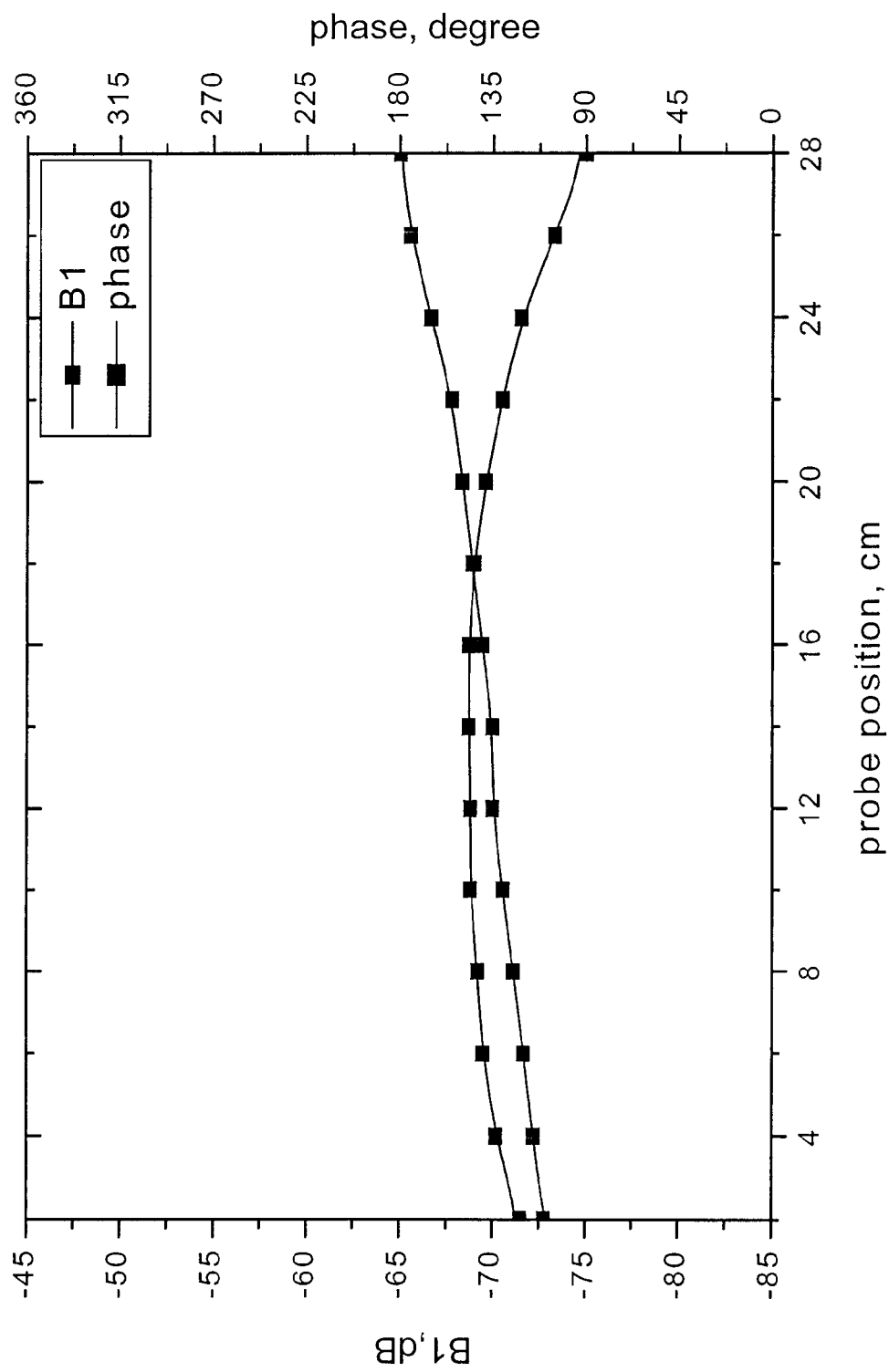

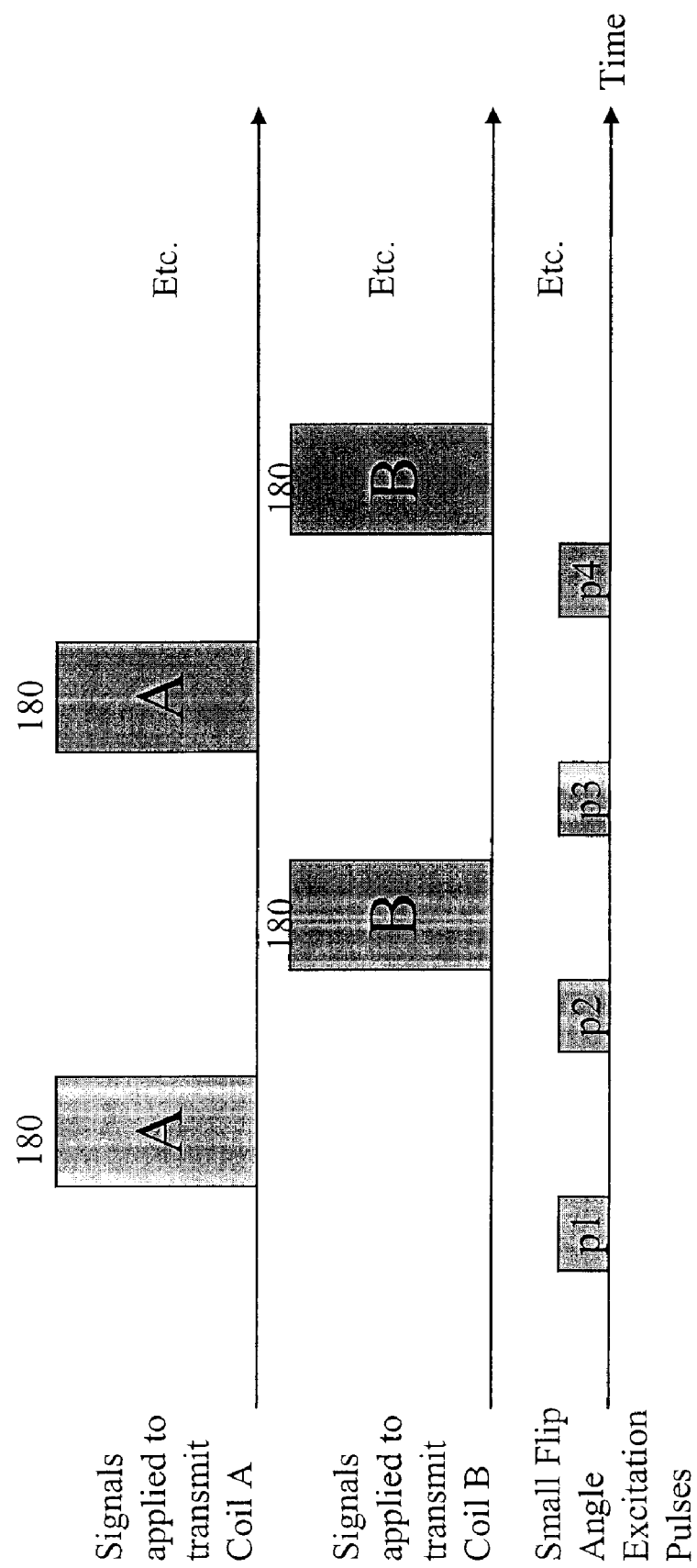

FIG. 9b

| Pulse # | Pulse Flip Angle | Soft Pulse Waveform Phase | PHASE AB Alternation Phase | Final Phase | Phase Gradient (deg/mm) |
|---|---|---|---|---|---|
| 1 | 10 | 0.19 | 0 | 0 | 0 |
| 2 | 3 | 180 | 0 | 180 | -1 |
| 3 | 10 | 0.7 | 180 | 0 | -1 |
| 4 | 4 | 180 | 0 | 180 | 0 |
| 5 | 10 | 1.18 | 0 | 0 | 1 |
| 6 | 3 | 180 | 180 | 180 | 0 |
| 7 | 10 | 1.53 | 0 | 0 | -1 |
| 8 | 4 | 180 | 180 | 180 | 0 |
| 9 | 10 | 1.69 | 0 | 0 | 1 |
| 10 | 3 | 180 | 180 | 180 | 0 |
| 11 | 10 | 1.58 | 0 | 0 | 0 |
| 12 | 4 | 180 | 180 | 180 | -1 |
| 13 | 10 | 1.18 | 0 | 0 | 0 |
| 14 | 3 | 180 | 180 | 180 | 1 |
| 15 | 10 | 0.48 | 0 | 0 | 0 |
| 16 | 4 | 180 | 180 | 180 | -1 |
| 17 | 10 | 0.49 | 0 | 0 | 0 |
| 18 | 3 | 180 | 180 | 180 | 1 |
| 19 | 10 | 1.69 | 0 | 0 | 0 |
| 20 | 4 | 180 | 180 | 180 | -1 |
| 21 | 10 | 3.01 | 0 | 0 | 0 |
| 22 | 3 | 180 | 0 | 180 | 1 |
| 23 | 10 | 4.35 | 0 | 0 | 0 |
| 24 | 4 | 180 | 0 | 180 | -1 |
| 25 | 10 | 5.6 | 0 | 0 | 0 |
| 26 | 3 | 180 | 0 | 180 | 1 |
| 27 | 10 | 6.64 | 0 | 0 | 0 |
| 28 | 4 | 180 | 0 | 180 | -1 |
| 29 | 10 | 7.39 | 0 | 0 | 0 |
| 30 | 3 | 180 | 0 | 180 | 1 |
| 31 | 10 | 7.77 | 0 | 0 | 0 |
| 32 | 4 | 180 | 0 | 180 | -1 |
| 33 | 10 | 7.74 | 0 | 0 | 0 |
| 34 | 3 | 180 | 0 | 180 | 1 |
| 35 | 10 | 7.32 | 0 | 0 | 0 |
| 36 | 4 | 180 | 0 | 180 | -1 |
| 37 | 10 | 6.53 | 0 | 0 | 0 |
| 38 | 3 | 180 | 0 | 180 | 1 |
| 39 | 10 | 5.45 | 0 | 180 | 0 |
| 40 | 4 | 180 | 0 | 0 | -1 |
| 41 | 10 | 4.18 | 0 | 0 | 0 |
| 42 | 3 | 180 | 0 | 180 | 1 |
| 43 | 10 | 2.84 | 0 | 180 | 0 |
| 44 | 4 | 180 | 0 | 0 | -1 |
| 45 | 10 | 1.53 | 0 | 180 | 0 |
| 46 | 3 | 180 | 0 | 180 | 1 |
| 47 | 10 | 0.36 | 0 | 180 | 0 |
| 48 | 4 | 180 | 0 | 0 | -1 |
| 49 | 10 | 0.59 | 180 | 180 | 0 |
| 50 | 3 | 180 | 0 | 180 | 1 |
| 51 | 10 | 1.25 | 180 | 0 | 0 |
| 52 | 4 | 180 | 0 | 180 | -1 |
| 53 | 10 | 1.61 | 180 | 0 | 0 |
| 54 | 3 | 180 | 0 | 180 | 1 |
| 55 | 10 | 1.68 | 180 | 0 | 0 |
| 56 | 4 | 180 | 0 | 180 | -1 |
| 57 | 10 | 1.5 | 180 | 0 | -1 |
| 58 | 4 | 180 | 0 | 180 | -1 |
| 59 | 3 | 180 | 0 | 0 | -1 |
| 60 | 4 | 180 | 0 | 180 | -1 |
| 61 | 3 | 180 | 0 | 0 | -1 |
| 62 | 4 | 180 | 0 | 180 | -1 |
| 63 | 3 | 180 | 0 | 0 | -1 |
| 64 | 4 | 180 | 0 | 180 | -1 |
| 65 | 3 | 180 | 0 | 0 | -1 |
| 66 | 4 | 180 | 0 | 180 | -1 |
| 67 | 3 | 180 | 0 | 0 | -1 |
| 68 | 4 | 180 | 0 | 0 | -1 |
| 69 | 3 | 180 | 0 | 0 | -1 |
| 70 | 4 | 180 | 0 | 0 | -1 |
| 71 | 3 | 180 | 0 | 0 | -1 |

FIG. 9e
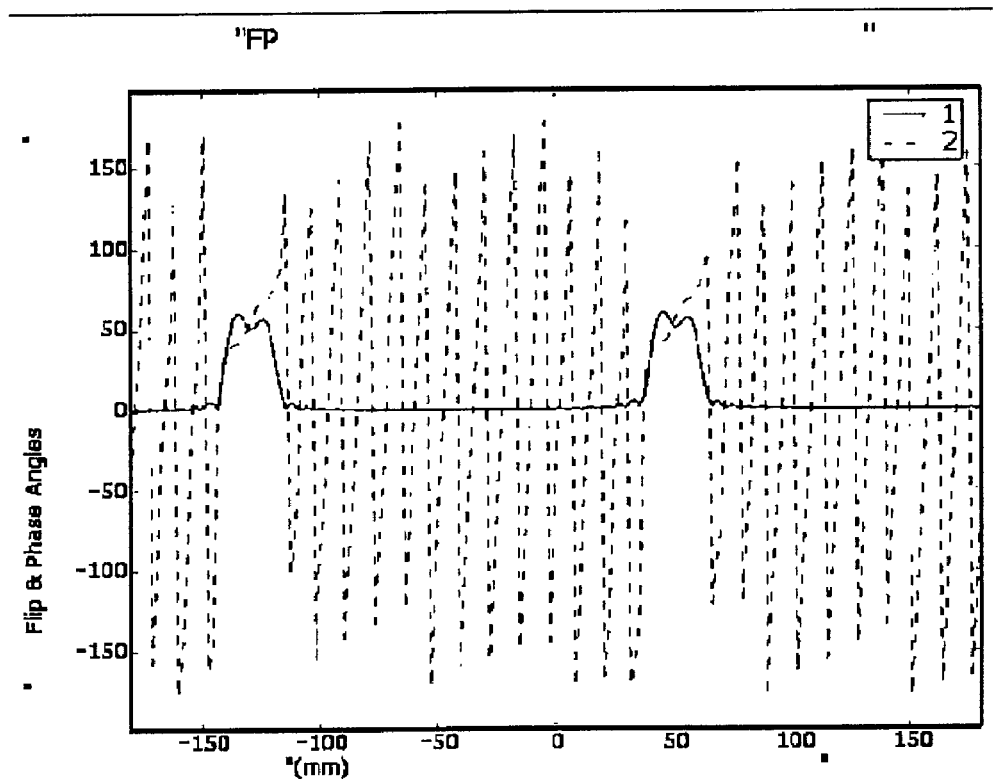
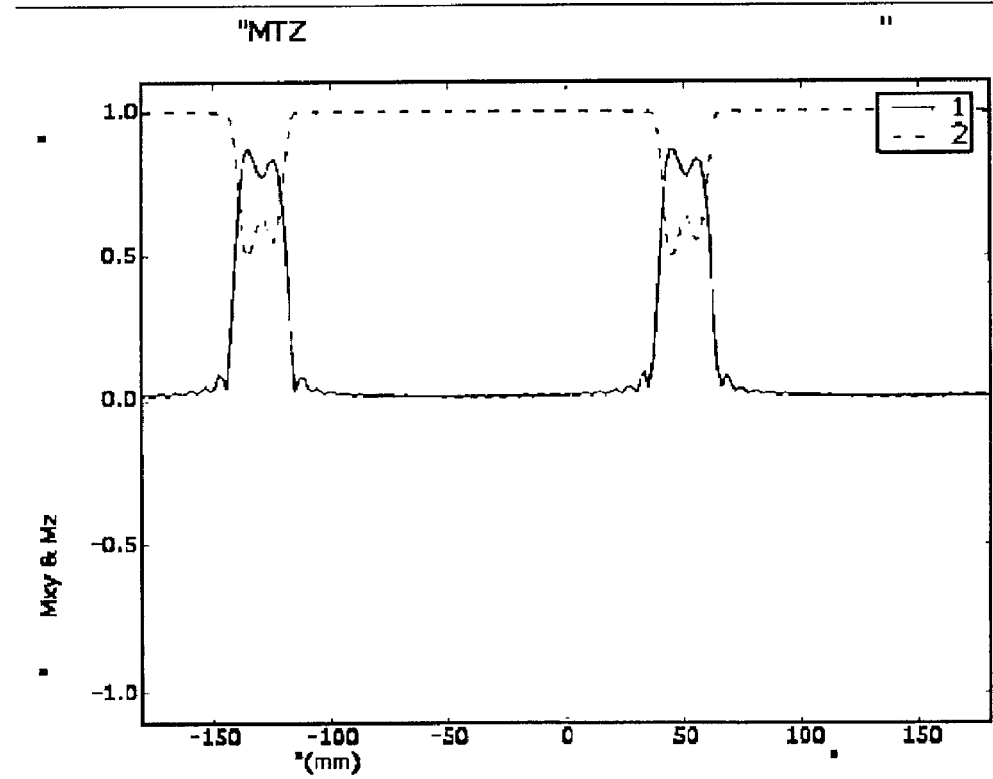

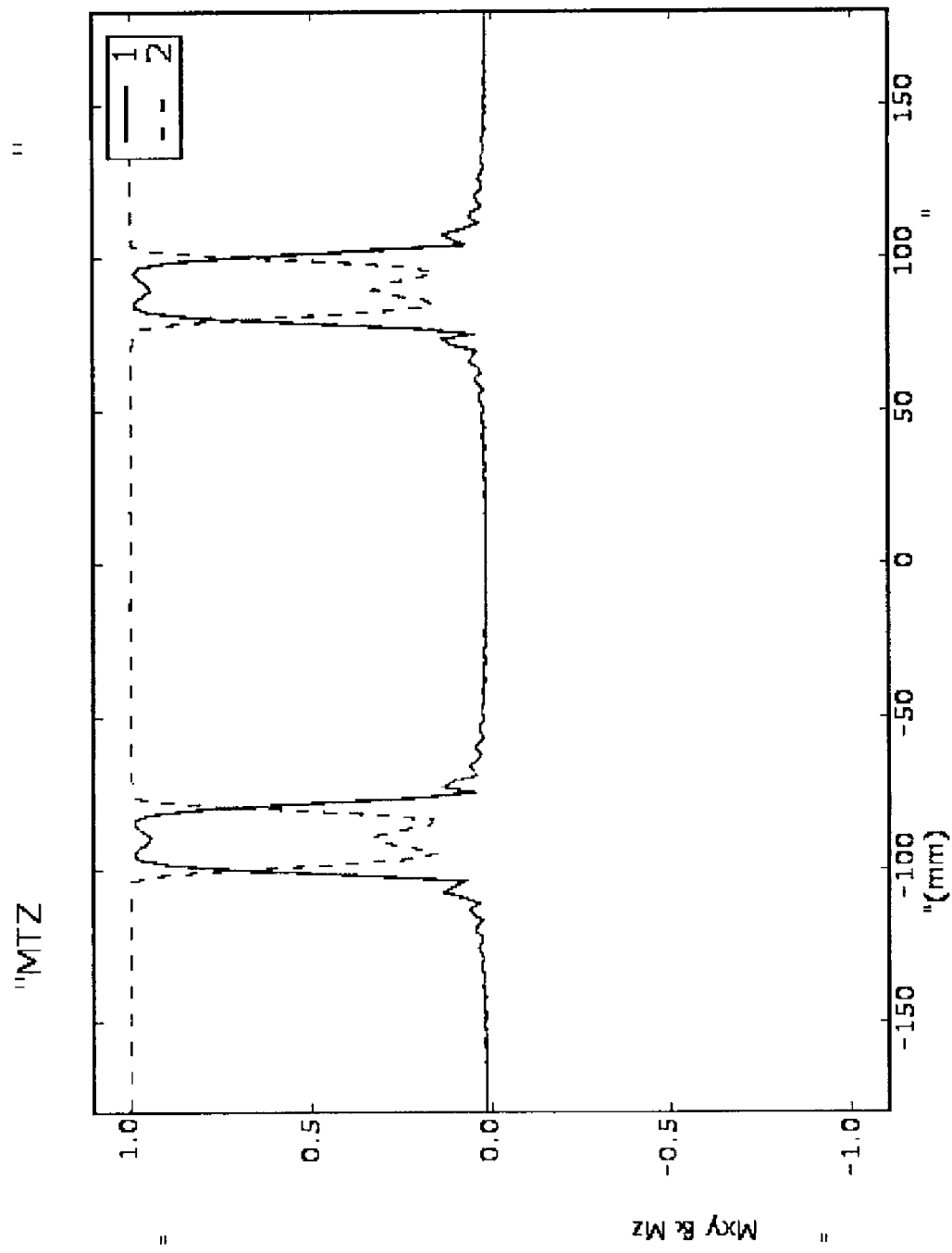

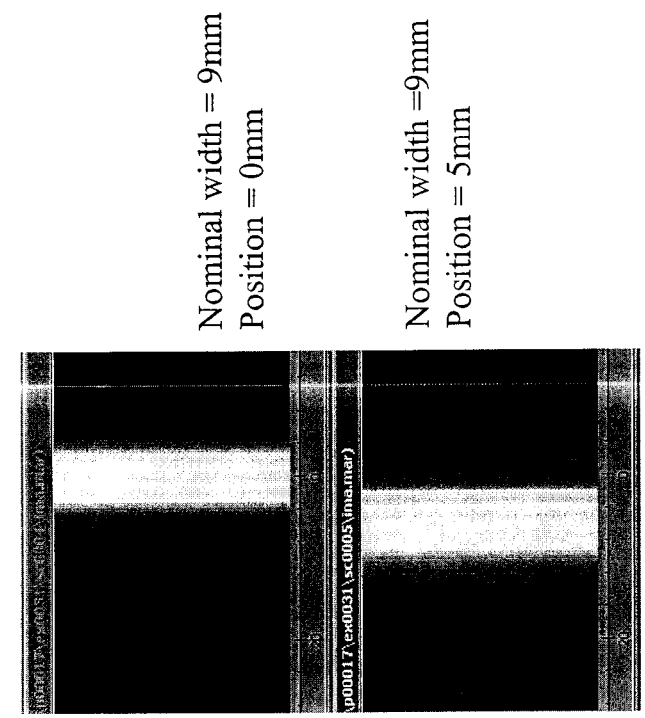
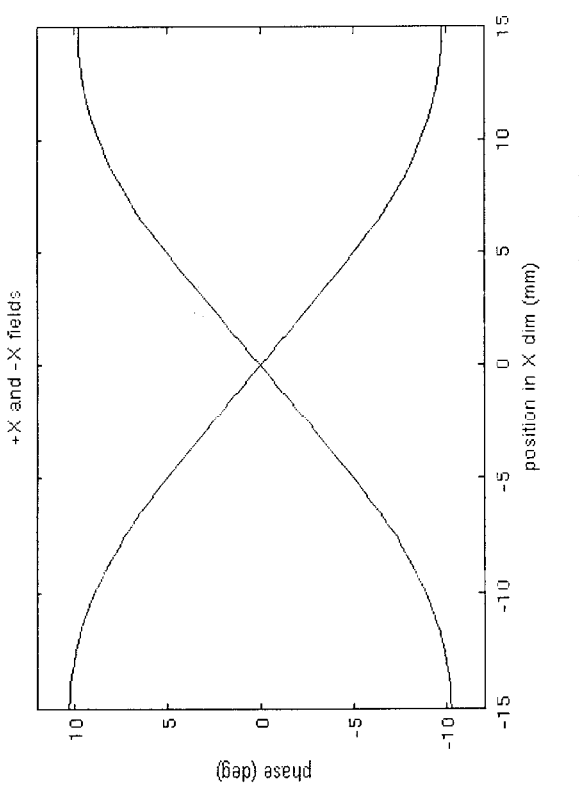
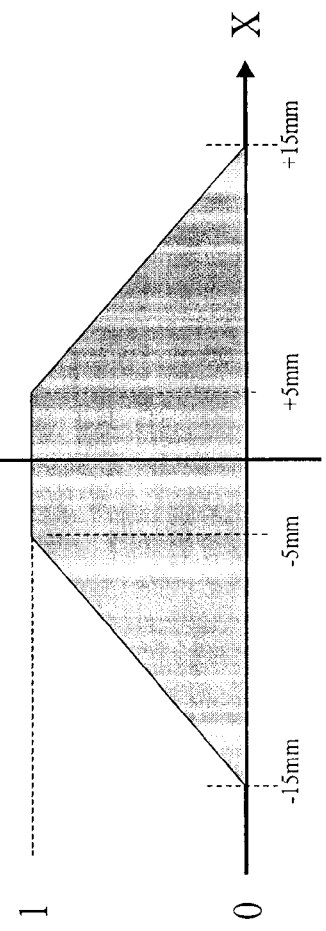
FIG. 10

FIG. 11
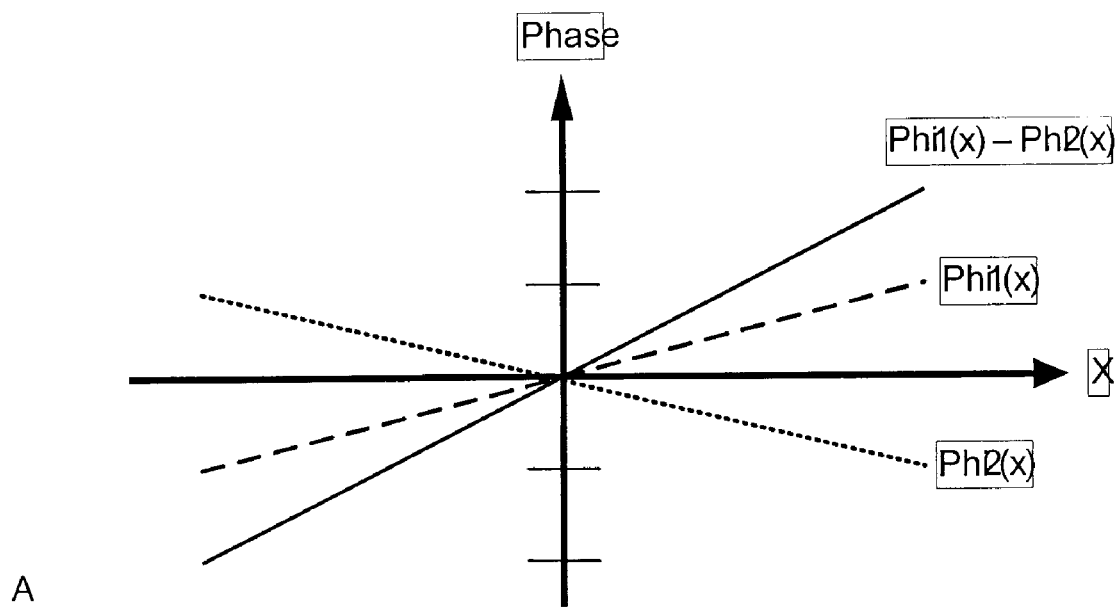
A
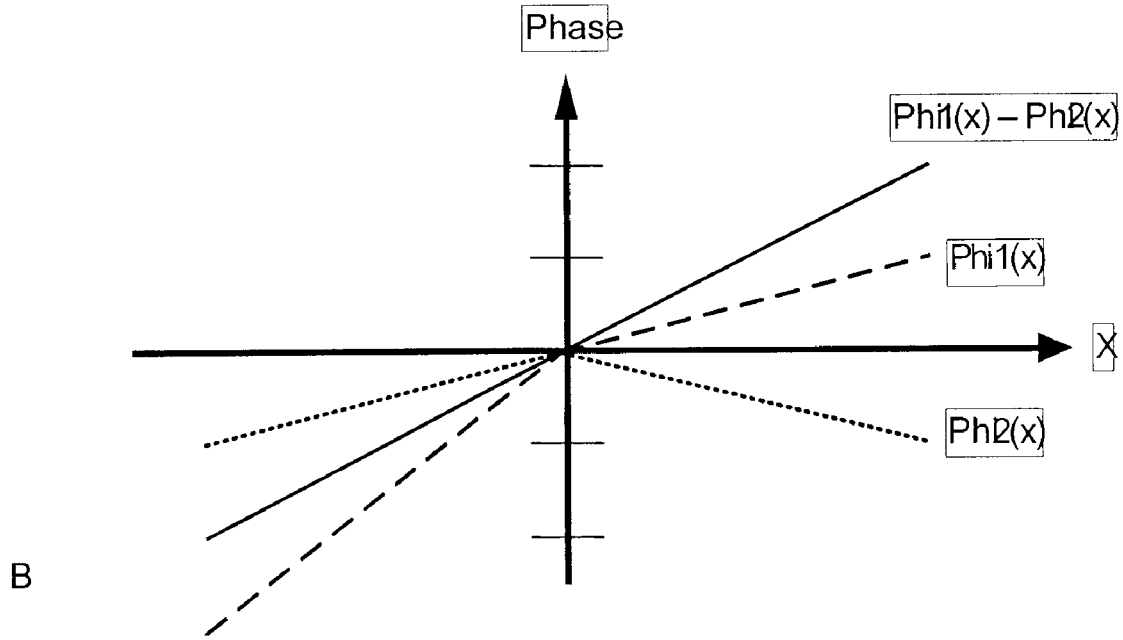
B

METHOD FOR RADIO-FREQUENCY NUCLEAR MAGNETIC RESONANCE IMAGING

CROSS-REFERENCE TO RELATED APPLICATIONS

This application is a national entry of International Patent Application Serial No. PCT/CA2008/000868 and claims benefit of provisional U.S. application Ser. No. 60/924,195, filed May 3, 2007, entitled "Method for Radio-Frequency Nuclear Magnetic Resonance Imaging", the entire contents of each of which are incorporated herein by reference.

FIELD OF THE INVENTION

The invention relates in general to the field of nuclear magnetic resonance imaging, and in particular to a technique for uniform k-space traversal using only a static magnet and an RF transmitter array.

BACKGROUND OF THE INVENTION

Magnetic resonance imaging (MRI) techniques have been in commercial use since the 1970s. The most commonly deployed MRI setups involve three magnetic field generators: a static uniform magnetic field, a gradient magnetic field system (three gradient fields required for 3-D imaging), and a radio-frequency (RF) transmitter, as well as one or more magnetic field detectors, in the form of an RF detector. Each of these is an expensive item in a whole body MRI. If one sub-system could be eliminated, then costs would be substantially reduced, and costs of efficiently providing the remaining fields can be made more efficient, and spatially compact.

The cost of producing these fields imparts high cost to Magnetic Resonance Imaging (MRI). Access to MRI and long waiting lists is an important issue for health-care worldwide. There is no effective low-cost imaging modality for imaging the central nervous system (CNS). The gradient pulse DB/dt (gradient pulse) is also limited by FDA regulations.

Lower cost MRI could open-up new application areas and markets.

Other RF Encoding Methods in MRI

The idea of using a RF transmitter to encode k-space (albeit in a different fashion) using amplitude gradient B1 fields is known in the art. For example, numerous recent patents and papers are devoted to Transmit SENSE type apparatus. Typically Transmit SENSE type apparatus do not remove the gradient magnetic field systems.

Rotating Frame imaging (rotating frame zeugmatography) (D. I. Hoult, J. Magn. Reson. 33, 183 (1979)) is an earlier method that attempts to form magnetic resonance images by use of magnet and RF coils only. This method has not been successful as a clinical imaging method however, principally because it requires very large flip angle RF pulses, which, for large samples, requires high RF power. The method has been used successfully in some smaller-scale applications, usually 1D experiments with surface coils, (J. Magn. Reson 60, 268-279 (1984), Michael Garwood, Thomas Schleich, Gerald B. Matson Spatial Localization Of Tissue Metabolites By Phosphorus-31 NMR Rotating-Frame Zeugmatography)

Another approach to RF-based localization, which is analogous to slice-selection, is taught by Bendall (J. Magn. Reson. 53,365-385 (1983), M. Robin Bendall, Roy E. Gordon, Depth And Refocusing Pulses Designed For Multipulse NMR With Surface Coils.). This method requires multiple excitations with phase-cycling to achieve selective excitation.

Related methods, using a gradient in the amplitude of the RF field and applied to micro-imaging only are taught, for example, in: P. Maffei, J. Magn. Reson. Series A 107, 40-49 (1994) NMR Microscopy by Radiofrequency Field Gradients; and F. Humbert, J. Magn. Reson. Series A, 123 242-245 (1996) NMR Microscopy by strong RF Gradients All of these approaches require RF fields with amplitude gradients.

APPLICANTS PRIOR ART

Applicant's U.S. Pat. No. 7,141,973 previously taught the use of an array of transmit coils, and claims a method for performing a magnetic resonance imaging experiment for elimination of gradient coils by application of RF refocusing pulses for generating spatial phase gradient B1 fields. The patent teaches that careful attention should be paid to the accumulated phase at different pixel positions.

There remains a need for a simplified method of traversing k-space defined by an image transformation kernel that preferably provides for a controlled step size and, further one that limits a number of B1 fields required to achieve the traversal.

SUMMARY OF THE INVENTION

Applicant has discovered that the accumulated spin magnetization phase at locations can be used for providing an orderly k-space traversal in an MRI procedure. By operating a transmit array adapted to produce two B1 fields in alternation, where the B1 fields are substantially uniform in amplitude over a sample volume of the MRI setup, and the B1 fields have respective spatial phase distributions such that selection of a difference in spatial derivatives of the spatial phase distributions permits control over a size of a step in k-space applied by successive refocusing pulses for generating the B1 fields in alternation. Each alternating refocusing pulse issued within a T2 time causes a step through k-space in an encoding direction determined by the difference in spatial derivatives.

In accordance with an aspect of the invention, there is provided a method of k-space traversal in an MRI procedure using a static magnet without the need for gradient field coils. The method involves providing an RF transmitter array that is operable to produce two fields (B1a, B1b), both of which having a substantially uniform amplitude over a sample volume, and each having a spatial phase distribution along a first coordinate direction of the sample volume such that a difference between spatial derivatives (G1a, G1b, respectively) of the spatial phase distributions of B1a and B1b defines a gradient difference field G1. The method further involves applying a pulse sequence to the RF transmitter array within one transverse relaxation period (T2), the pulse sequence including at least three iterations of refocusing pulses applying B1a and B1b in alternation. Accumulated spin magnetization phase from previous applications of B1a and B1b permit the uniform stepping through k-space with each iteration of the alternating refocusing pulses.

The step of applying the pulse sequence may involve applying the at least three iterations of alternating refocusing pulses which are separated by at most one of: one or more small flip angle excitation pulses, and one or more acquisition windows between each of the refocusing pulses.

The RF transmitter array provided may be operable to produce B1a and B1b having the spatial phase distribution in the first coordinate direction along one of a coordinate axis, a radial coordinate direction, and an azimuthal coordinate direction.

The pulse sequence applied may include at least one excitation pulse followed by iterations of the alternating refocusing pulses interrupted only by an acquisition window between at least some of the refocusing pulses, to effect a sampling of the MRI signal during traversal through receive k-space. The pulse sequence applied may include at least one excitation pulse followed by iterations of the alternating refocusing pulses interrupted only by small flip angle excitation pulses between at least some of the refocusing pulses, to effect a spatially selective excitation by traversal through excitation k-space. The pulse sequence applied may include both selective excitation and sampling parts.

By applying a long pulse sequence having a number of iterations of refocusing pulses N, a directly proportional resolution of the walk through the k-space is provided.

The B1a and B1b fields may have phase distributions that vary substantially linearly along the first coordinate direction within the sample volume, in which case a Fourier image transform kernel is applicable.

The method may provide the k-space traversal through at least two dimensions by providing the RF transmitter array operable to further provide a third B1 field (B1c) that is also substantially of uniform amplitude throughout the sample space and has a continuous spatial phase distribution along a second coordinate direction, where the first and second coordinate directions span a surface within the sample space. In this case applying the pulse sequence to the RF transmitter array includes applying at least three iterations of refocusing pulses generating B1c and one of B1a and B1b in alternation to step through k-space in a direction associated with the second axis.

Preferably the first and second coordinate directions are orthogonal and the B1a and B1b fields are constant along the second coordinate direction and B1c is constant along the first coordinate direction. Furthermore preferably B1a is constant along the first coordinate axis and the three iterations of alternating refocusing pulses are applied to generate B1a and B1c, so that linearly independent k-space stepping is provided. Alternatively B1c can be alternated with another B1c' field that is produced by the RF transmitter array where B1c' varies and is constant in the same directions as B1c.

The method may provide the k-space traversal through three dimensions by providing the RF transmitter array operable to further provide a fourth B1 field (B1d) that is also substantially of uniform amplitude throughout the sample space and has a continuous spatial phase distribution along a third coordinate direction, where the three coordinate directions span the sample volume. In a similar fashion the B1 fields can be chosen to provide linear independence of the steps through k-space. The three coordinate directions may be Cartesian.

The RF transmitter array provided may consist of a plurality of independently driven coils, or an array of elements that are either independently controlled or controlled by a network, for example.

The method may further include applying a second pulse sequence to the RF transmitter array within a subsequent transverse relaxation period (T2), the second pulse sequence having a different excitation prior to the at least three iterations of refocusing pulses applying B1a and B1b in alternation. This permits uniform stepping through k-space starting from a different origin and may provide a second walk through the k-space having points intermediate the points of the first walk, so that in two shots a higher density of points are produced.

Further features of the invention will be described or will become apparent in the course of the following detailed description.

BRIEF DESCRIPTION OF THE DRAWINGS

In order that the invention may be more clearly understood, embodiments thereof will now be described in detail by way of example, with reference to the accompanying drawings, in which:

FIGS. 1a-c are schematic illustrations of equipment for effecting the present invention;

FIG. 3 shows output of two MRI simulations comparing a method of the present invention and a standard FSE method with a same resolution;

FIG. 4 is a schematic illustration of a 1D RF transmit array having 8 elements linearly arranged adapted to generate a phase-distributed B1 field;

FIG. 5b shows the linearity of a calculated phase difference ($\Delta\phi$) and an estimated B1-magnitude distribution of the B1 field generated from a first embodiment of the two element array of FIG. 5a;

FIG. 5c shows comparative output using the k-space traversal method of the invention with the first embodiment of the two element array of FIG. 5a on a 7 Tesla static magnet;

FIG. 5d shows the linearity of phase gradients and B1-magnitude distributions of the B1 fields generated from a second embodiment of the two element array of FIG. 5a;

FIGS. 5e,f, are high resolution 1D images of phantoms taken using a 0.2T static magnet, FIG. 5g are high resolution 1D images showing that lower flip angle pulses (than 180°) can be used;

FIG. 5h is a high resolution 1D image of a two-compartment water phantom;

FIGS. 6b,c are a schematic illustrations of walks in 2D k-space and a legend illustrating k-space foci of 5 coils showing how pairs of steps in 2D k-space affect a position in k-space;

FIG. 6d-h are schematic illustrations, and lists of refocusing pulses to produce walks in k-space;

FIGS. 7a,b schematically illustrate-4 element arrays for producing constant amplitude linear phase gradient B1 fields;

FIG. 7d shows the linearity of phase gradients and B1-magnitude distributions of a B1 field generated from the 4-element array of FIG. 7c;

FIG. 8a schematically illustrate 6-element arrays for producing constant amplitude linear phase gradient B1 fields;

FIG. 8b is an image of an embodiment of the 6-element array of FIG. 8a;

FIGS. 8c-e show the linearity of phase gradients and B1-magnitude distributions of a B1 field generated from the 6-element array of FIG. 8b;

FIG. 9a is a schematic images of a pulse train sequence for a walk in excitation k-space;

FIG. 9b is a table showing a full pulse sequence for a 1-D simulation experiment;

FIG. 9e shows simulated slice selection results with slice shift;

FIG. 9f shows simulated slice selection results using a composite pulse;

FIG. 10 schematically illustrates how B1 fields having non-linear phase distributions throughout the sample volume can be used for k-space traversal; and FIG. 11 schematically illustrates how a linear phase difference between 2 gradient fields can be produced without the individual fields having linear phase distributions.

DETAILED DESCRIPTION OF EMBODIMENTS

Figure 1C:
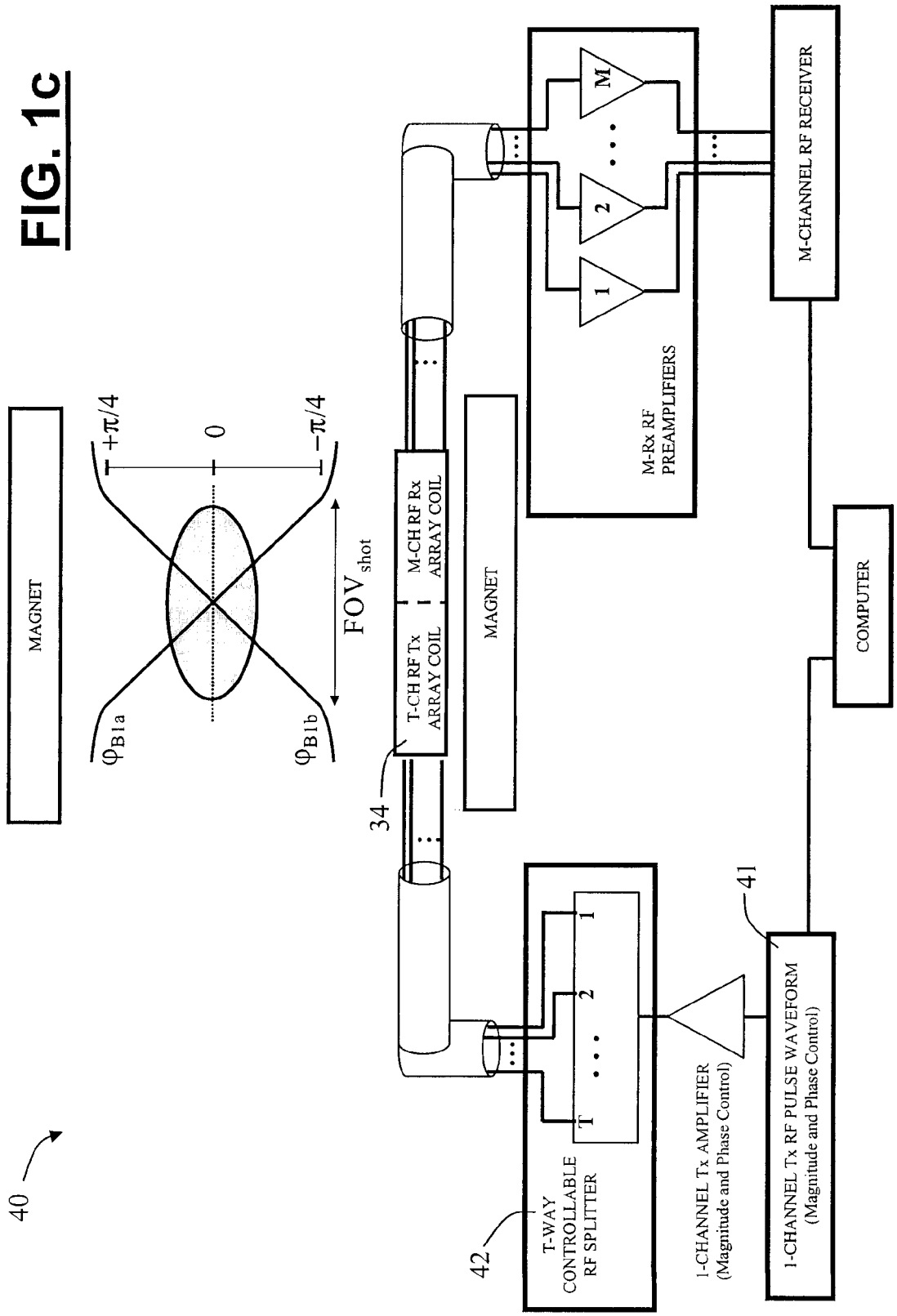

Herein terms of mathematical idealization are used to refer to orientations and properties of fields (constant, linear, uniform) and the coils or array of elements used to produce them. It will be appreciated by those of skill in the art that any idealization is intended to convey a reasonable range or an approximation to the idealization as befits the term in the context of the embodiment.

A method is provided for traversing a k-space within a magnetic resonance imaging (MRI) setup that only requires a static magnetic field and a radio-frequency (RF) transmitter array.

K-space is a representational space for describing the state of a spin system in MRI. Specifically, it offers a description of the phase state of an excited spin system. K-space describes spin system phase state in terms of the components of linear spin phase.

Spatial frequency is a measure of how often a structure repeats per unit of distance. The SI unit of spatial frequency is cycles per meter. For instance, a sample with a spin phase difference of 90 degrees (pi/2 radians) over 10 cm would have k=0.25 cycles/0.1 m=2.5 cycles/meter. If this linear phase difference is along the x-axis, then: $k_x$=0.25. In such a way, the state of a spin system with spin phases which vary linearly with distance only can be described by three numbers ($k_x$, $k_y$, $k_z$).

In general the method of k-space traversal in an MRI procedure involves using a static magnet without the need for gradient field coils involves providing an RF transmitter array that is operable to produce at least two fields (B1a, B1b), both of which having a substantially uniform amplitude over a sample volume, and each having a spatial phase distribution along a first coordinate direction of the sample volume. The spatial phase distributions along the first coordinate direction are chosen so that a difference between vector spatial derivatives (G1a,G1b, respectively) of the spatial phase distributions of B1a and B1b defines a gradient difference field G1. The method then involves applying a pulse sequence to the RF transmitter array within one transverse relaxation period (T2), the pulse sequence including at least three iterations of refocusing pulses applying B1a and B1b in alternation. Accumulated spin magnetization phase from previous applications of B1a and B1b permit the uniform stepping through k-space with each iteration of the alternating refocusing pulses. This permits k-space to be traversed with uniform step size, and by quickly alternating these steps a high and uniform resolution can be obtained. By adding further B1 fields that vary in different (preferably orthogonal) directions k-space can be traversed in multiple directions.

FIG. 1a is a schematic drawing of a MRI setup 10 in accordance with an embodiment of the invention. MRI setup 10 includes a static magnet 12 for generating magnetization signal from an object within a sample volume 14 of the MRI setup 10. In this embodiment, no gradient coils or associated electronics are required, and a single RF transmitter array 16 consisting of two transmit coil elements 18 (Tx-coil A, and Tx-coil B) is selectively coupled to an electrical power source 20 by a two-way switch 22. Two-way switch 22 is adapted to deliver RF pulses from the electrical power source 20 to either Tx-coil A or Tx-coil B, which produce required B1 fields $B1_a$ and $B1_b$, as further described below. An M-channel receive phased array 24 is shown for signal reception, as an example of detection means for measuring responses/echoes from the object, although other detection schemes could equally be used, including those that use the same B1 fields as produced by the TX-coils A,B 18.

FIG. 1b is an alternate embodiment of the invention. MRI setup 30 is shown that differs from that of FIG. 1a in that traditional gradient coils 31 and associated electronics 32 are included, and in the constitution of the RF transmitter array 16. Insofar as MRI setup 30 is identical to MRI 10, the features are not described again. The use of traditional gradient coils 31 in conjunction with the invention may be advantageous, in transmit TRASE embodiments to replace some of the magnetic field gradient pulses. For example, transmit TRASE embodiments may be used for spatial encoding in one spatial direction, and traditional magnetic field gradient encoding could be used in another spatial direction. Alternatively TRASE encoding may be performed for slice selection and traditional gradient amplitude magnetic fields can be used for readout.

The RF transmitter array 16 shown in FIG. 1b includes a multi-channel transmitter 34 having many transmit elements spatially arranged, and for each element thereof, a respective RF power supply 36 is independently coupled. Each element receives RF pulses that are independently phase and magnitude controlled so that the superposition of the fields produced by the elements subjected to the individually phase and amplitude adjusted RF pulses produce the desired $B1_a$ or $B1_b$ within the sample volume 14. Naturally control and timing signals are required to implement parallel modulation of the RF pulses, and the RF pulses may be shaped in a manner known in the art. In this embodiment the $B1_a$ or $B1_b$ fields are generated by altering the phase and magnitude of the RF transmit signals applied to elements of the Tx-array.

In this embodiment the same elements can be used for both transmission and reception, for example by switch-coupling the elements to both receiver channels and the respective RF power supply, or separate elements may be used for transmission and reception, as shown.

FIG. 1c is a schematic illustration of a MRI setup 40 in accordance with a further embodiment of the invention in which the multi-channel transmit (Tx) phased array 34 is driven by a single RF power supply 41, via a phase and magnitude controllable RF signal splitter 42 so as to produce the required $B1_a$ or $B1_b$ fields in alternation. The remainder of this embodiment is the same as FIG. 1b, and will not be described again. It will be apparent to those of skill in the art that the number of RF power supplies, and elements of the transmit array can vary according to system requirements, and further that there are numerous electronically equivalent control mechanisms and architectures possible for interconnecting the one or more RF power supplies with the two or more transmit array elements.

While the foregoing examples show a multi-channel receive phased array, it will be appreciated that in simplified embodiments a single channel receiver may be used, and that there may be advantages to using multiple different phase distribution B1 fields for receiving.

Principles of K-Space Traversal

In Fourier based MRI, the image transform kernel is a complex exponential involving variables k, and r (position). Hence, the phase term in the kernel depends on position. This is well suited for MRI since the magnetization also precesses about the B0 magnetic field where the phase angle of the transverse magnetization in a plane transverse to the B0 field direction is dependent on the precession frequency. In standard MRI encoding, an amplitude gradient magnetic field is used, that is linear with position along an encoding direction. Therefore, the phase of the transverse magnetization will have a linear dependence upon position in the gradient encoding direction. In the TRASE MRI method, at least one B1 field with phases that vary linearly with position in the encoding direction is used. Although linear transformations are well known, corrections can be made to the reconstruction if the phase distribution of the B1 fields is not linear with position along the encoding direction. Alternatively, an entirely different image transformation can be accomplished using a wavelet transform that would require the phase distribution of the B1 fields to satisfy the phase basis requirements of the particular wavelet transform used.

B1 Field Phase Distributions

Within an object in a sample volume of the MRI static magnet, an excitation of the sample will cause nuclei to precess about the B0 field, where the frequency of precession is proportional to the B0 field strength. Therefore, for a uniform B0 field, in the absence of any magnetic field amplitude gradients, the phase of magnetization signal contributions from different spatial locations is constant. To provide spatial encoding in traditional MRI, the phase of this transverse magnetization signal at different spatial positions is made to depend on the spatial position along a selected encoding direction. The signal received by a detection coil sensitive to precessing transverse magnetization is given as, $$S_n(k) = \int dr M_{xy}(r) e^{i\phi(r)} = \int dr M_{xy}(r) e^{i(2\pi k \cdot r)} = \int dr M_{xy}(r) e^{i(2\pi n \Delta k_n \cdot r)}$$

The unknown quantity of interest is the density of atoms at a particular position which is proportional to the transverse magnetization $M_{xy}(r)$, and can be computed using a Fourier transformation. In typical Fourier encoded MRI, this is done using magnetic field gradients which act to alter the precession frequency linearly with distance, such that the phase change in the encoding direction can be described as an azimuthal rotation in the transverse plane of magnetization at different positions, which is, in general, a linear change in the phase angle of the transverse magnetization signal at different positions along an encoding direction. Therefore, in the encoding direction, the magnetization phase follows a circular/azimuthal rotation relative to the phase at a reference position along this encoding direction. The traversal through k-space with equal size steps Δk, can occur as equal time steps while applying a constant gradient (frequency encoding), or alternatively using phase encoding, as multiple applications of a gradient pulse of amplitude nΔG, for a fixed time T. In this phase encoding technique, the signal in k-space is given by, $$S_n(k) = \int dr M_{xy}(r) e^{i(\gamma n \Delta G T r)}$$

The aim of Fourier-based TRASE methods is to create equivalent magnetization phase as a function of position, without using changes to the B0 field (that is, without magnetic field gradients). This can be accomplished by applying excitation and refocusing pulses to generate a B1 field with the phase of the B1 field that possess a different phase as a function of position in an encoding direction as the magnetization would have due to one such pulse of a magnetic field gradient applied, i.e. along a coordinate direction of a coordinatization of the sample volume.

A second B1 field is required that has a different spatial distribution of phase gradient in the encoding direction than the first B1 field. This means that either of the two B1 fields may have a phase distribution that is constant along the encoding direction, as long as the other possesses a phase distribution, such that the phase is shifted or rotated in the transverse plane, for different positions along the spatial encoding direction. It is the gradient in the phase difference that is important for this technique.

An exemplary spatial phase distribution for each of these B1 fields is shown schematically in (FIGS. 1a,b,c) in one dimension, the spatial phase distributions are linear, producing constant gradient fields and thus define a coordinate direction (Cartesian axis) of the sample volume. While in the examples described herein the encoding direction is a linear axis, it will be appreciated that radial or azimuthal axes corresponding to different coordinatizations of the sample volume are equally possible giving rise to encoding directions. Both of the B1 fields have phase gradient fields in the same coordinate direction (along the same axis, but of opposite signs), and so the difference between the phase gradient fields in the coordinate direction is uniformly defined. In this example, the difference in these phase distributions over the sample volume is equal to pi. As such, each B1 field's linear phase gradient RF field (B1) must have the form:

$$B_1 = |B_1| e^{i\phi_1(r)}, \phi_1(r) = 2\pi k_1 \cdot r = G_1 \cdot r$$

assigning zero phase at r=0. The vector $k_1$ describes the direction and degree of twist inherent in the RF field. Also $k_1$ represents a point in 3D k-space: $k_1 = (k_{1X}, k_{1Y}, k_{1Z})$, in units of spatial frequency (cycles/m), so we also term it the phase gradient k-space focus. $G_1$ is the RF phase gradient in radians/m. For a coil with uniform phase: $k_1 = G_1 = 0$. Given an initial longitudinal magnetization, $M_0$, a 90° RF excitation pulse applied to a phase gradient coil results in transverse magnetization (signal) of:

$$M = M_0 e^{i\phi(r)} = M_0 e^{i2\pi k_1 \cdot r}$$

The first key point to RF excitation with a $B_1$ phase gradient is therefore that the spin system is excited directly to the k-space coordinate $k_1$, with spatial encoding immediately contained in the phase of the NMR signal using a single RF pulse (of any shape or type: square, sin c, adiabatic, ... ), and is mathematically equivalent to encoding with standard frequency gradients, (see first equation in [0068]). So TRASE is truly a k-space traversal method, unlike past RF encoding methods. Unfortunately this approach to high resolution imaging is flawed as it demands the generation of $B_1$ fields with impractically large phase gradients. This RF field generation constraint is analogous to that encountered by rotating frame imaging which required fields of very high amplitude to achieve high resolution, leading to RF power deposition problems, and was one reason these RF methods never made it to the clinic. High resolution can be achieved by exploiting the properties of the NMR spin-echo to effectively amplify the phase gradient strength by orders of magnitude.

When applied with a phase gradient field a 180° RF pulse rotates a transverse vector $M_-$ about the $B_1$ field direction $\phi(r)$ to $M_+$ thus:

$$M_+ = M_-^* e^{i2\phi(r)} = M_-^* e^{i2\pi[2k_1 \cdot r]}.$$

So refocusing results in both a reversal in sign (k→−k) due to the complex conjugation of M, but also a jump along the encoding direction of +2$k_1$, so:

$$k_+ = -k_- + 2k_1.$$

The refocusing action is thus equivalent to a reflection about the coil k-space origin $k_1$ as: $(k_+ - k_1) = -(k_- - k_1)$, see FIG. 2b. Fortunately, this is consistent with the familiar behaviour of a uniform phase coil (for which $k_1 = 0$). However from this equation, we can see that using the same phase gradient for both excitation and refocusing (i.e. setting $k_1 = k_-$) is ineffective and the k-space location after refocusing is unchanged. That is, no additional spatial encoding or further k-space traversal is achieved. The solution and final key step is to introduce a second phase gradient into the spin-echo experiment.

So consider an array coil capable of producing either of two different phase gradients $G_{1A}(r)$ and $G_{1B}(r)$, with respective k-space origins $k_{1A}$ and $k_{1B}$. For a pulse sequence consisting of excitation followed by an alternating train of refocusing pulses: $90_A$-$180_A$-$180_B$-$180_A$-$180_B$- . . . , the k-space coordinate (after each 180° pulse) as observed by field $B_{1A}$ accumulates as: $(0, -\Delta k_{BA}, +\Delta k_{BA}, -2\Delta k_{BA}, +2\Delta k_{BA}, \ldots)$, where $\Delta k_{BA} = 2(k_{1B} - k_{1A})$. (Note that in reception, a phase gradient coil receives the signal with an additional k-space shift of $-k_1$). Therefore the key to high resolution TRASE MR imaging is to repeatedly refocus using alternating phase gradients, allowing the signal phase or k-space trajectory to accumulate to higher k-space states.

Generally the effect of a pair of refocusing pulses (A,B) on any initial k-space vector is a translation of $2(k_B - k_A)$, thus any pair of fields define an encoding axis. After N+1 refocusing pulses (N even), k-space is covered centrically from $-(N/2)\Delta k_{BA}$ to $+(N/2)\Delta k_{BA}$. The field-of-view which can be encoded without aliasing, in this single-shot, single receive field experiment, is given by $FOV_{shot} = 1/\Delta k_{BA}$, and is equivalent to the distance over which $\phi_A(r) - \phi_B(r)$ is equal to $\pi$. Spatial resolution is then $FOV_{shot}/N$.

Encoding Equivalence

We note that experiments with phase-gradient RF coils can be described using the k-space formalism. From this it will follow that for every prior art k-space-based MR method there is an equivalent experiment which uses phase-gradient RF coils instead of static (or low/audio frequency) magnetic field gradients.

Full equivalence between encoding with phase-gradient coils and frequency gradient-coils requires the same axes, and that both types of gradient coil have the same spatial response, for example both linear. The k-space formalism assumes linear gradients.

FIGS. 2a,b schematically shows a pulse echo train used for K-space traversal during acquisition. The pattern of alternating (A pulse—Acquire Echo-B pulse—Acquire Echo) which would be expected to continue (for 1 dimensional imaging) to allow collection of 128 echoes. The first pulse is the excitation pulse (90 degree pulse). The subsequent (wider) pulses have a flip angle of 180 degrees (refocusing).

Figure 2B:
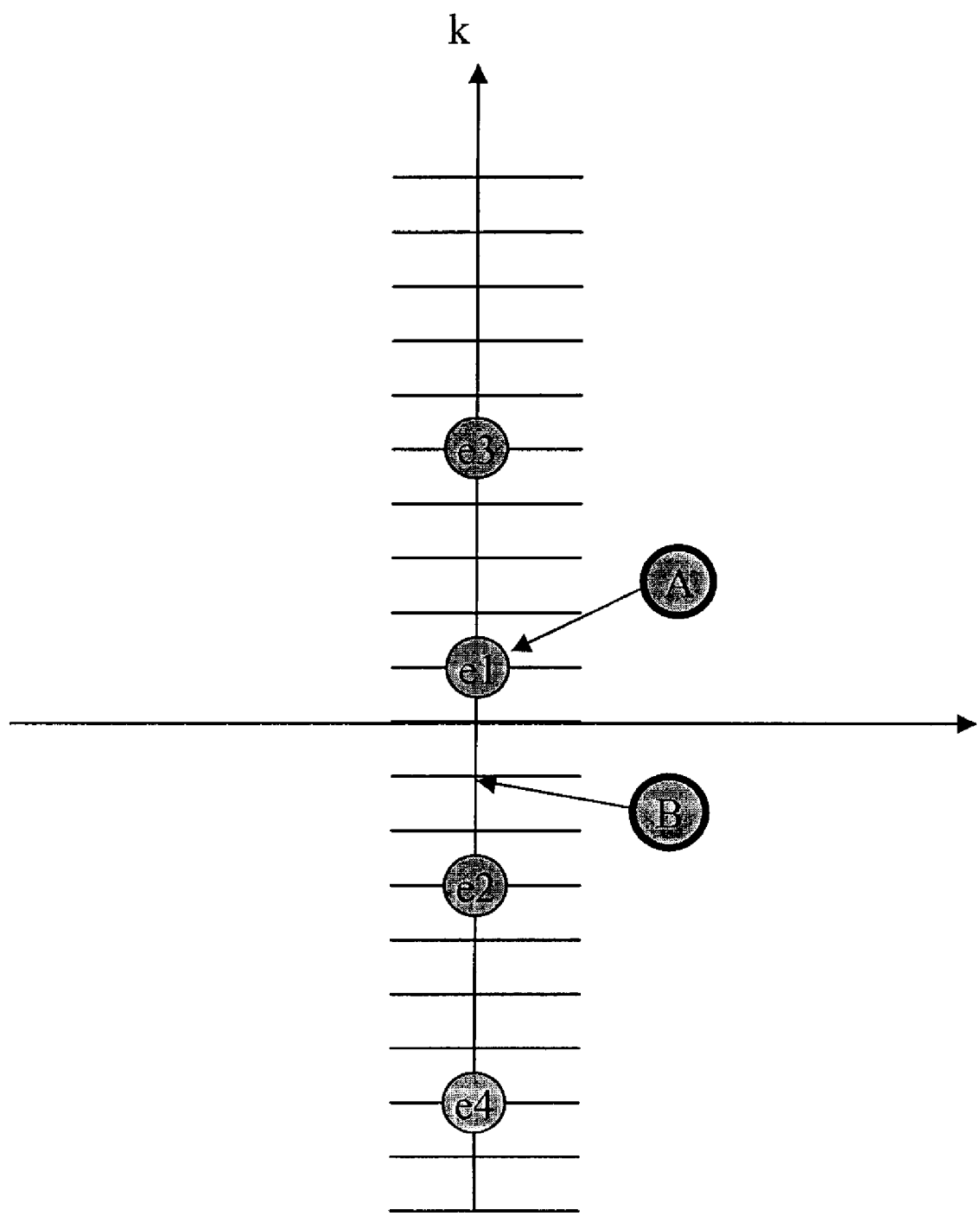
FIGS. 2a,b are schematic illustrations of a pulse sequence for a walk in receive k-space, and the k-space walk, respectively.

Data acquisition in k-space (1D) is shown in FIG. 2b. This is the k-space sampling pattern for the 1D experiments herein, truncated to show only the k-space locations of the first 4 echoes only (labeled e1 to e4). Subsequent echoes in the train follow the same pattern. The effect of a refocusing pulse using the 'A' transmit field is to refocus the spins about the on-axis point at the line labeled 'A', and similarly for 'B'. Data reordering according to this diagram, followed by Fourier transformation (FFT) yields a 1D image profile, as shown in following figures.

It should be noted that each echo acquisition window e provides an interval of time during which acquisition can be performed. The acquisition can be accomplished using different a dedicated RF B1 field from a receive array. It should be noted that the RF B1 field, could be the same as one of the A and B fields and further could be measured from the same field used for emitting the A and B fields, and as such the receive array could be the same as the transmit array. Furthermore within the echo acquisition window multiple different B1 fields can be sampled to yield different respective data points, subject to the limitation that sampling from a specific field B1 occurs exclusively in the window before or the window after the refocusing pulse with the B1 field. The concept of multiple acquisitions with different coils to provide different data points is known in the art from a paper by Bankson J A entitled: *SMASH imaging with an eight element multiplexed RF coil array* (MAGMA 10 (2000) 93-104), but unlike the multiplexed RF coil array taught there, each point can be independently processed in the present apparatus.

FIG. 3 shows two simulated MRI images used to compare the k-space traversal using RF phase gradient coils (in the horizontal direction) in lieu of amplitude gradient coils used in the prior art. In both examples conventional amplitude gradients were assumed for readout in the vertical direction. The simulation was a Bloch equation MRI simulation (T1=1 sec, T2=75 msec, matrix size=64×64) of the TRASE-FSE method using B1 fields having +2 pi and a −2 pi phase gradients with uniform magnitude and linear phase distributions. Both images required 4-shots, with 16 echoes per shot, for complete k-space sampling (FIG. 3a), is compared to a standard 4-shot FSE image (FIG. 3b). The phase gradients were assumed to be perfect.

Using only two different B1-fields, with uniform magnitude and linear phase distributions, TRASE-FSE produces nice images (FIG. 3a) very comparable to images obtained using standard gradient encoding (FIG. 3b). The FOV relationship described is also shown in these results, as 4-shots are required for an object occupying the entire volume of a ±2 pi coil pair ($\Delta\phi = 4$ pi), where $FOV_{shot} = \frac{1}{4}$ coil length.

Transmit Coil Arrays

A B1 field with a particular phase distribution and uniform amplitude across the sample volume can be generated in several ways. In general, a multi-transmitter 34 schematically shown in either of FIGS. 1b,c can be used where the RF pulses transmitted into all elements of the array at substantially the same time, but the RF signal amplitude and phase delivered to each array element is independently controlled such that the resultant B1 field, which is simply a superposition of the individual fields created from each array element, is the desired field such as $B1_a$. For the next refocusing pulse, the amplitude and phase of the RF transmit signals delivered to each element is adjusted such that the resultant total field produced by the Tx-array is now the $B1_b$ field.

Linear Arrangement

FIG. 4 is a schematic illustration of an example of an 8-element array 50 that might be used to generate a particular B1 field phase distribution along a particular 1D axis labeled as the phase encoding direction 52. If all elements of the array depicted have a substantially similar electrical properties, and are driven with a common RF voltage with a particular amplitude and phase, each would produce a field that has the same amplitude and phase, but over different spatial regions along the encoding direction. Altering the phase of this applied voltage to any one of the elements results in that element's B1 field having a phase relative to the other B1 fields that is different, e.g. rotated in a clockwise or counterclockwise fashion relative to the B0 direction. Therefore, by applying the RF voltage to the individual elements with a voltage-phase shifted by pi/4 clockwise relative to the previous element's voltage moving along the encoding direction, the last element would produce a B1 field with a 2 pi clockwise phase relative to the first element. When driven in such a way, the resultant superposition B1 field would have a phase that starts at zero, and rotates clockwise through 2 pi, along the encoding direction. If the voltage phase applied to each element is altered as to produce successive pi/4 shifts in a counterclockwise fashion, then the resultant B1 field, would now have a phase that starts at zero, and rotates counter-clockwise through 2 pi, along the encoding direction. Thus if the first B1-field ($B1_a$) has a +2 pi phase gradient, and the second B1-field ($B1_b$) has a −2 pi phase gradient, a difference of 4 pi over the length of the array is produced by alternation of the $B1_a$ and $B1_b$ pulses.

Spiral Birdcage

Figure 5A:
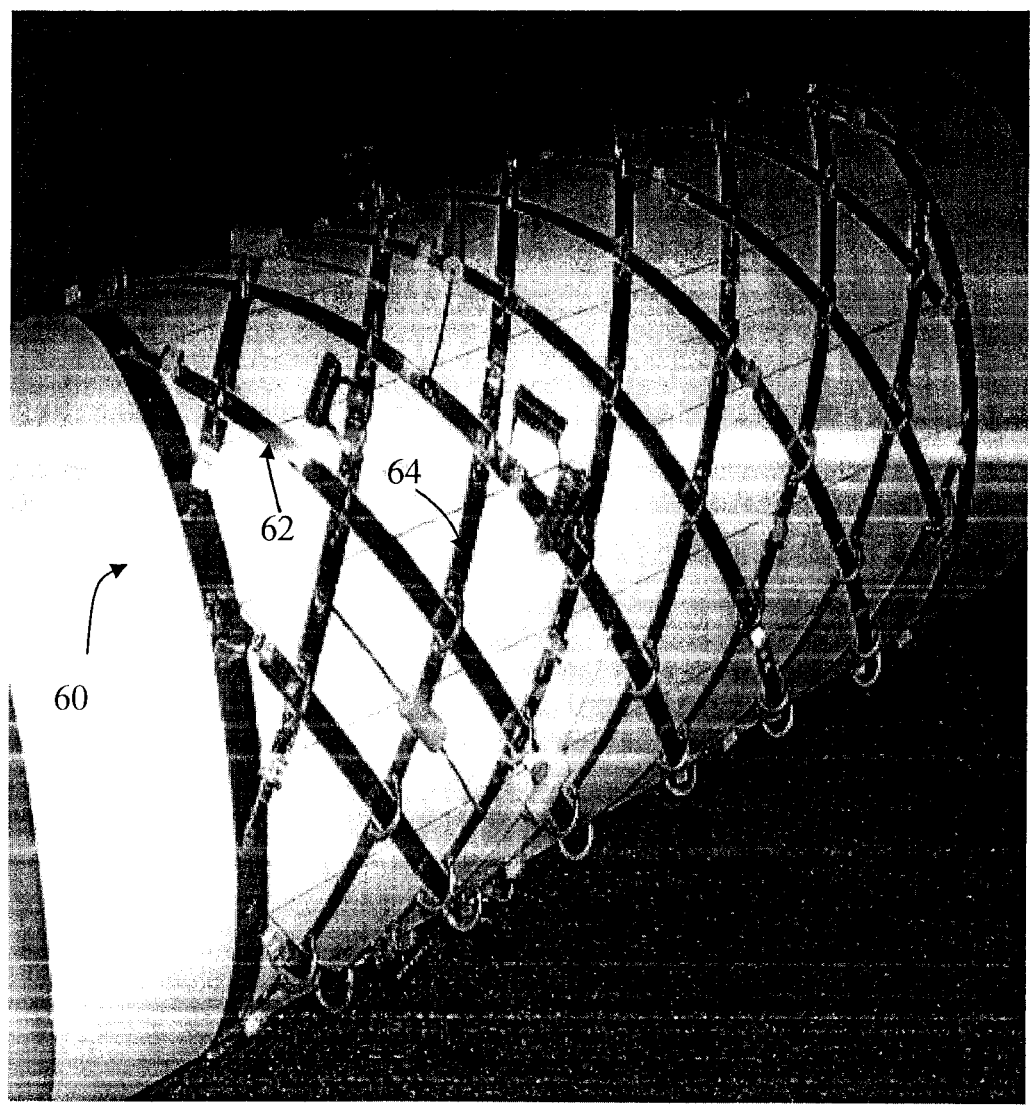
FIG. 5a is an image of a two element (spiral birdcage) RF transmitter array adapted to generate a phase-distributed B1 field.

FIG. 5a shows a two-element array 60 where each element 62,64 has a physical geometry and conductor layout such that when an RF pulse is delivered to either element, the element inherently produces the required phase distribution of the $B1_a$ or $B1_b$ fields, respectively. For example, the two-element array 60, with the first element 62 consisting of a first spiral birdcage coil with a clockwise twist along its axis of +pi, which results in a region with a substantially uniform amplitude field with linear $B1_a$ phase distribution of +pi, and the second element 64 consisting of a second spiral birdcage coil with a counter-clockwise twist along its axis of −2 pi, which results in a region with a substantially uniform amplitude field with linear $B1_b$ phase region distribution of −pi.

A first embodiment of two element array 60 consisted of two 10 cm diameter, 25 cm long, 300 MHz spiral birdcage coils: one with a 15 cm+pi and the other a 15 cm−pi phase distribution along the central axis of the array.

FIG. 5b (left) shows a plot a difference in phase gradients between the two B1 fields of the first embodiment of the two element array 60. The phase difference (Δφ) distribution was mapped by calculating the phase of the ratio of two separate gradient echo images, each obtained using a different Tx-coil. It will be appreciated that the difference in phase gradients is exceedingly linear and is substantially 2pi in extent.

FIG. 5b (right) shows B1 field strengths of the first embodiment of two element array 60. A low flip angle GE image from each coil was used to estimate each coils B1-magnitude distribution.

FIG. 5c shows for comparison images acquired using a K-space traversal according to the invention with the B1 fields of the first embodiment of the two element array 60, with standard gradient encoding. On the left, an image of a standard 1-shot, 32 echo, 15 cm×15 cm FOV FSE image. On the right, an image of a 1-shot 32 echo, 15 cm FOV TRASE-FSE image with gradient phase encoding turned off, but rather using the pulse sequence of FIGS. 2a,b by switching between the two spiral birdcage coils during transmission. This phase-direction 1-shot FOV~7.5 cm, which is the length of the two ping pong balls lying beside each other. This experiment was performed in a 7 Tesla static magnet.

The first 7 Tesla experimental TRASE-FSE image has some blurring and exhibits limited resolution, but this can be expected from using such an inhomogeneous B1-field distribution (FIG. 5b), where it was found that B1-magnitude homogeneity and proper Tx-power scaling are the key to obtaining nice images. At these high field strengths, it is obvious that B1-shimming will be required, and the TRASE technique may be better suited for lower frequency applications.

Figure 5D:
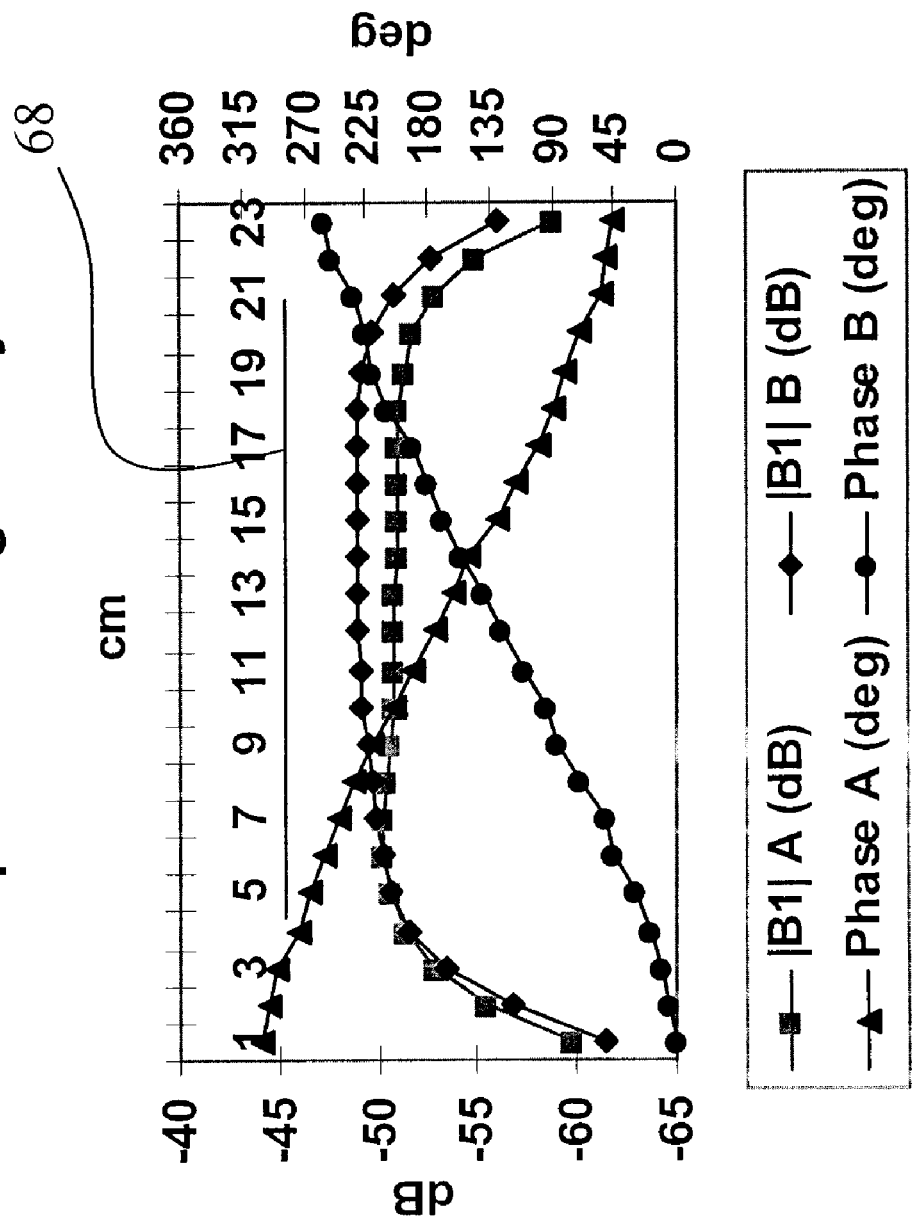

A second embodiment of the two element array 60 has been operated to obtain a more constant amplitude. FIG. 5d The phase gradients of the two birdcage coil elements 62,64 as a function of axial position within the array 60 (degrees of phase are listed on the right hand vertical axis), and the uniformity of the amplitude of the field within the coil as a function of the axial position (left hand vertical axis shows dB loss). It is noted that at least within the 5-20 cm range 68 the losses are substantially uniform (−48 to −52 dB), and that the substantially linear phase gradients within this range vary by about 180 and −180 degrees, respectively.

FIGS. 5e-g use the following experimental setup performed in a 0.2T static magnet using the second embodiment of the two element array 60. The 0.2T system was assembled in-house, and consisted of a standard configuration MRI system, with console, gradient system and RF system. The RF system was enhanced to allow switching between different RF coil transmit fields by using PIN diode switching, under pulse sequence control.

The system used a TMX console (NRC, Winnipeg, Manitoba, Canada) operating at 8.2 MHz was installed on a low field animal research system. The console is interfaced with a permanent 0.2 Tesla, 45 cm free gap, 4-poster magnet (AMAG, Poland), 3-axis linear gradient amplifiers (Techron, USA), and a low frequency RF amplifier (Tomco Technologies, AU).

The console hardware includes: frequency references, waveform generation, multi-channel digital data acquisition, analog RF receiver front-end and transmitter chain, hardware interfaces and built-in test facilities. In use, this hardware is interfaced to peripherals assemblies, including power amplifiers and the shim PSU.

Miscellaneous slow control functions, including gain settings, shimming control, eddy current pre-emphasis configuration, loopback control and gating configuration are performed by an independent control system ('Asynchronous System'). The server communicates with the GUI PC via a TCP/IP connection.

The console sequencer software executes on a high performance x86 PXI computer (National Instruments, Austin, Tex.) running a real-time operating system (RTOS) and generates synchronous waveform and digital control data over the PCI bus. A PCI DAC card produces five channels of 16-bit analog waveform output at 100 k samples per second (RF transmit I & Q envelopes, Gx, Gy, Gz), while a high speed digital output card (NI PXI-6534) generates frequency and other control signals.

The pulse sequencer is modified to control digital TTL output lines which are used to control diode current drivers and which activate PIN diode switches. The PIN diodes are part of the coil array assembly. The PIN diodes are switched to select the coil or coil elements needed to produce the desired phase gradient.

FIG. 5e schematically illustrates a 1D profile experimentally produced using the second embodiment of the two element array 60. A small water phantom was moved by 1 cm increments in the sample volume within the second embodiment of the two element array 60, which was within the 0.2 Tesla (T) magnet. The image can be seen to move in regular intervals. This shows that the imaging method is functioning correctly. An artifact is visible in the 2nd panel, but this can be eliminated by increasing the phase of the B pulses by 90 degrees as seen in the $2^{nd}$ panel in FIG. 5f.

FIG. 5g shows that the refocusing can still be effective even with lower flip angles. The left panel is data acquired with a nominal 180 degree flip angle (using the composite pulse).

The second panel shows a similar result with a nominal flip angle of 150 degrees (i.e. pulse amplitude reduced by the factor 150/180).

FIGS. 5e,f and g are high resolution images produced without a gradient field. A pulse sequence according to FIG. 2 was used. The images are single shot images with 128 refocusing pulses interspersed by acquisition windows during which a single coil was used for data acquisition.

FIG. 5h is a high resolution image produced without a gradient field, using only the second embodiment of the two coil array 60 for K-space traversal. In this experiment a two-compartment water phantom (2.5 cm diameter water-filled syringe) was used. This is schematically illustrated (top), photographed (mid) and imaged using the same 0.2T magnet.

The experimental 1D profile was obtained by Fourier transformation of acquired k-space data from TRASE (ETL=64), RF pulses: 90° (0.4 ms), 180° (0.8 ms), single train, pulse spacing 5 ms.

Because each spiral birdcage coil inherently produces a unique linear phase gradient, the experiment is carried out by simply transmitting with one coil at a time, with the other actively shut off using a PIN diode switch. A single transmit and receive channel were used.

Sampling 2D k-space with 3 Fields

A method is provided for using three (or more) phase-gradient B1 fields to move a spin system over a 2D k-space.

Three coils, each with a different k-space focus corresponds to three foci in total. From these three foci, three pairs of foci are possible, i.e. the pairs (1,2), (1,3) and (2,3). Each pair represents a direction in k-space. If the coil fields (B1 fields) are designed so that the three directions are not collinear, then the three foci define a plane in k-space. The three directions (or 6 including positive, negative directions) all lie within this plane.

Then by a suitable sequencing of refocusing pulses (by extension for the 1D case using 2 B1 fields) the spin system can be moved around in this 2D plane of k-space. If the spin system is moved around to sample this 2D k-space plane the acquired data may be reconstructed to yield a 2D image (Bernstein 2005, Chapter 11 and Chapter 12). There is an equivalent operation in excitation k-space (c.f. sampling k-space) in which three transmit fields can be used to define a 2D selected excitation.

The Use of 4 Fields to Move Through 3D k-space

Four fields are sufficient to move the spin system over a three dimensional k-space. This represents full 3D encoding capability. From 4 fields there are six pairs (12, 13, 14, 23, 24, 34) each of these pairs represents a line in k-space. There are therefore 12 directions of movement. One example of a transmit array offering this capability, and thus being a complete gradient coil set, is a 4-element array with one uniform field and three linear phase gradient fields, which the three linear phase gradients being in orthogonal directions.

Orthogonal Arrangement of Coils

Figure 6A:
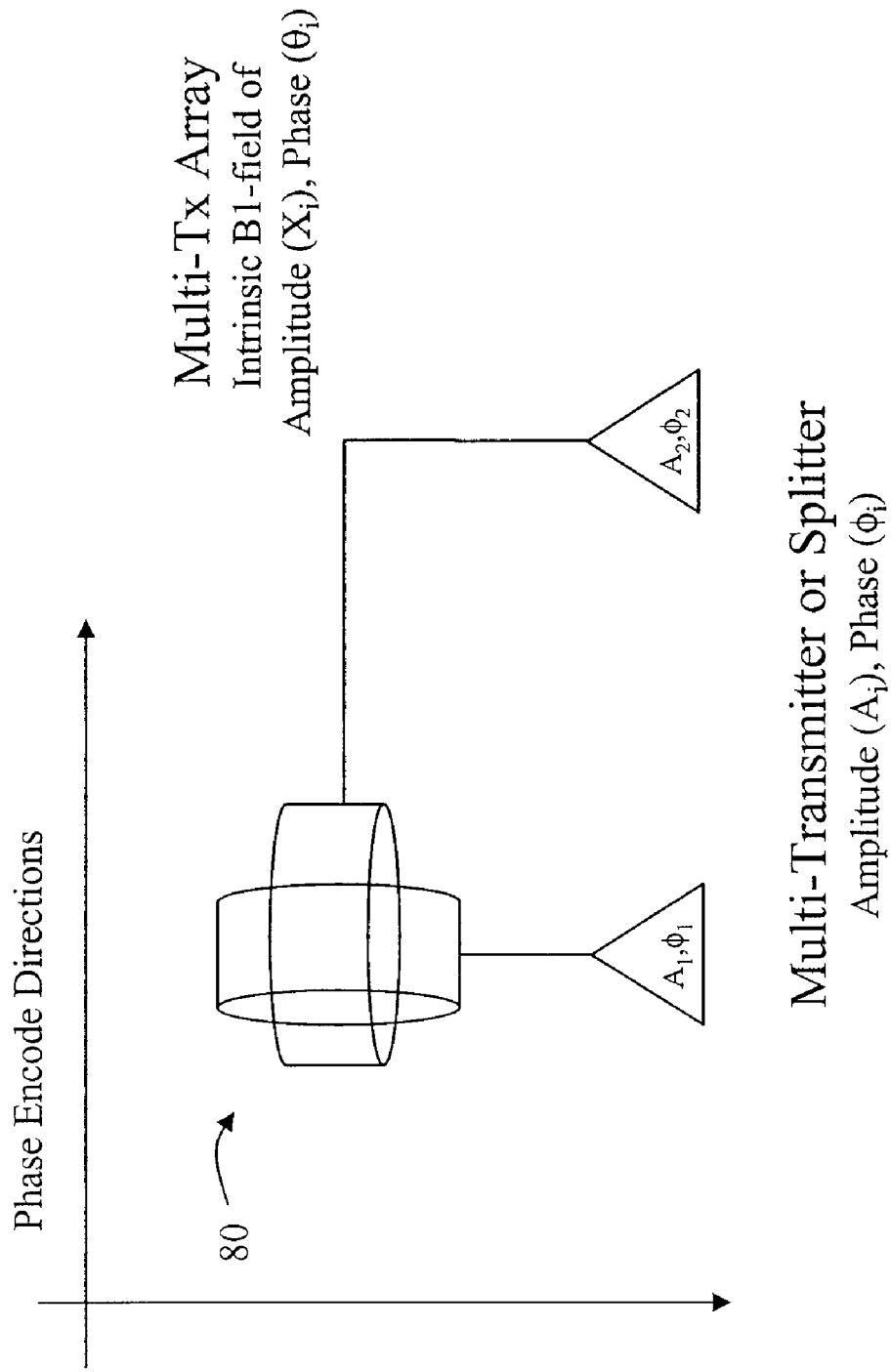
FIG. 6a is a schematic illustration of a transmit array for 2D imaging.

FIG. 6a is a schematic illustration of a 2-coil array 80 for producing B1 fields of constant amplitude and linear phase distribution in two directions across the sample volume, upon energization by controlled, selected RF pulses delivered to each coil. Two different sets of RF pulses are delivered to the respective coils, the RF pulses having amplitude, phase and waveform selected so that a particular phase distribution is achieved.

FIG. 6b,c are schematic illustrations of multidimensional traversals of K-space. The traversal may be linear on axis FIG. 6b (bottom), as representative of the foregoing examples in 1D, or may be linear off axis as shown in FIG. 6b (top). FIG. 6c is a legend showing how pairs of refocusing pulses affect a position in k-space. The effect of a pair of refocusing pulses is to translate the k-space by the vector shown. This shows that it is possible to move the in any of 12 directions in 2D k-space. While this legend shows the effect of these 5 B1 fields, it will be appreciated that other fields could be used and that similar legends can be computed analogously. Likewise 3D traversals can equally be produced but cannot be represented on paper.

Figure 6E:
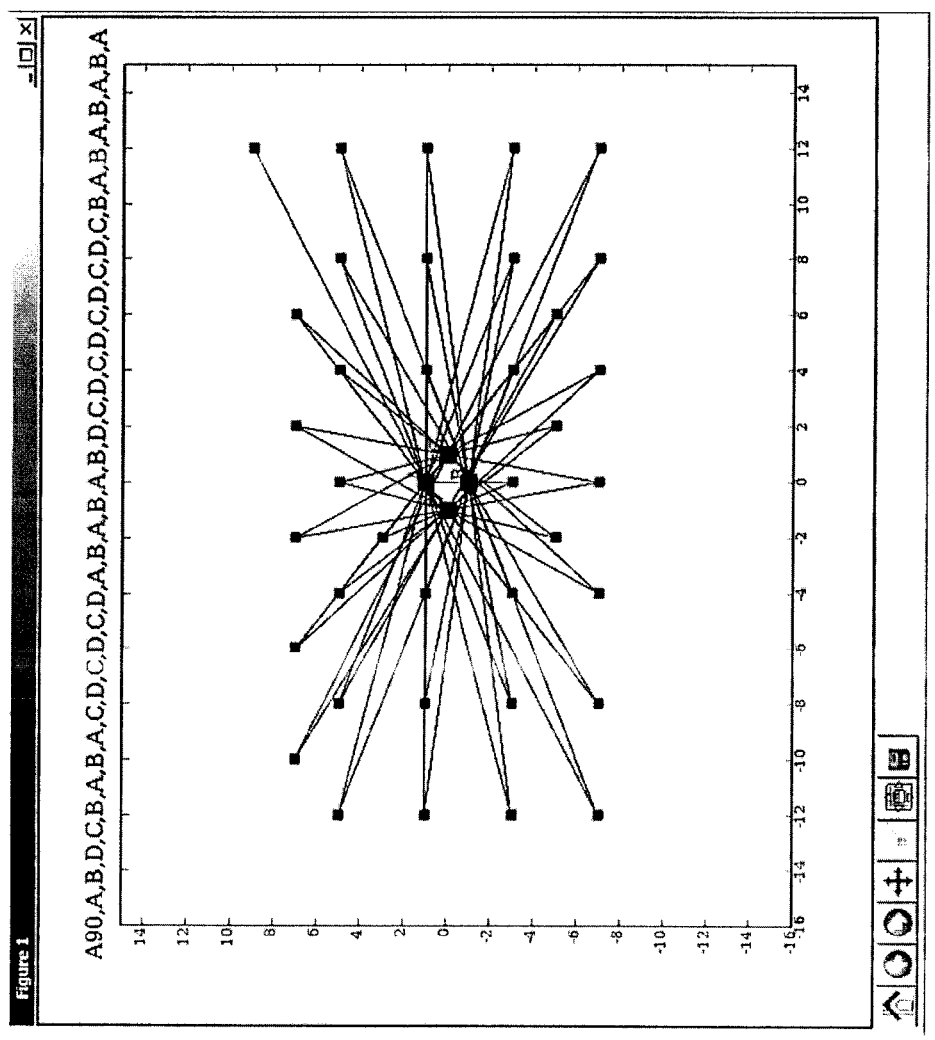

FIG. 6d shows a variety of paths that can be traced through 2D k-space, and FIG. 6e shows a method of covering 2D k-space. The 4 central dots in each panel represent k-space foci of the 4 coils assumed for this example. It will be noted that the bottom left of the 4 dots does not correspond to a coil used, rather the top right is the A coil focus, the top left is the coil focus C, bottom right is B. FIG. 6f-h list specific walks through k-space to cover planes or lines, for example. It will be appreciated that the possibilities are endless and that there may be preferences for different walks depending on different applications.

FIG. 7a,b schematically illustrate a second kind of arrangement of loops that produce coils operable to produce constant amplitude, phase gradient coils, referred to herein as 4-element array. The coils may be operable to produce a B1 field of constant amplitude and linear phase distribution in both the x-direction (FIG. 7a) and y-direction (FIG. 7b) of the sample volume, upon energization by controlled, selected RF pulses delivered to each element so that a controlled phase distribution can be achieved. The 4-element array consists of two pairs of coils, the paired coils are parallel and oppose each other with the sample volume in between. The parallel planes of the two pairs are orthogonal to each other to enclose the sample volume.

One of the pairs (referred to as a Helmholtz pair) has elements that are driven so that the electrical current flows in a same direction as each other (co-rotating coils). The other pair (Maxwell pair) has coils that are driven so that the electrical current flows in opposite directions (counter-rotating coils).

In the embodiment produced, the Helmholtz pair has 3-turns whereas the Maxwell pair has 1-turn, such that for equal power splitting to each pair, the Helmholtz B1-field magnitude will be approximately three times stronger, which when combined with the Maxwell pair B1-field will produce a substantially uniform amplitude phase gradient field.

It will be appreciated that two different sets of RF pulses could be delivered to the respective pairs, the RF pulses having amplitude, phase and waveform selected so that a particular phase distribution can be achieved, and further that 4 different RF pulses could be supplied to each coil. This would allow the same coils to be used for both x and y encoding and for encoding 0 phase gradient fields.

Figure 7C:
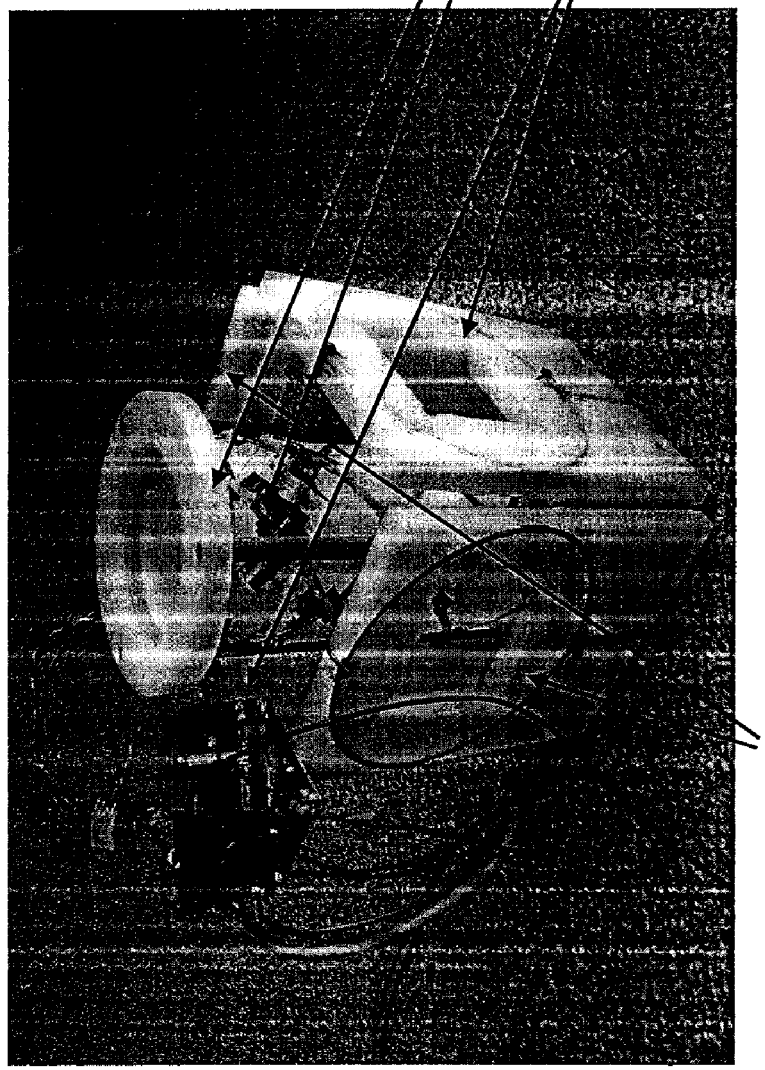
FIG. 7c is an image of an embodiment of the 4-element array of FIG. 7 with a spiral birdcage array.

FIG. 7c is an image of a Tx-array coil used for 2D imaging containing a +2Pi and −2Pi spiral birdcage coil for z-direction phase encoding (vertical) and a co-rotating pair of three turn loops together with a single turn counter-rotating pair of loops. When energized in parallel using (in this case a single transmitter with a power splitter), the co-rotating pair and counter-rotating pair produce two more phase gradients in the x-direction (+¾pi and −¾pi).

While the asymmetry of the number of turns of the co-rotating and counter rotating coils is useful for enabling a single power supply, it has the consequence that the coils cannot be alternated between serving as Helmholtz and Maxwell pairs, and thus the specific embodiment of FIG. 7c is limited to 2 dimensional imaging. It is further noted that a fifth field with a zero phase gradient (referred to as a uniform field) can also be achieved by energizing only the co-rotating current Helmholtz field portion of the array as shown in FIG. 7b.

FIG. 7d shows plots of the one of the two B1 x-phase gradient fields produced from the Helmholtz and Maxwell field combinations of the 4 large loops as a function of axial position within the array. The opposite B1 x-phase gradient field is not shown but has similar properties. Degrees of phase are listed on the right hand vertical axis, and the uniformity of the amplitude of the field within the coil as a function of the axial position is shown on left hand vertical axis (in dB loss). The curve generally with positive slope is the phase plot, and the concave up curve is the plot of dB loss. It is noted that across the extent of the sample volume the dB losses are within 5% and the phase distribution is substantially linear, ranging over about 135°.

Figure 7E:
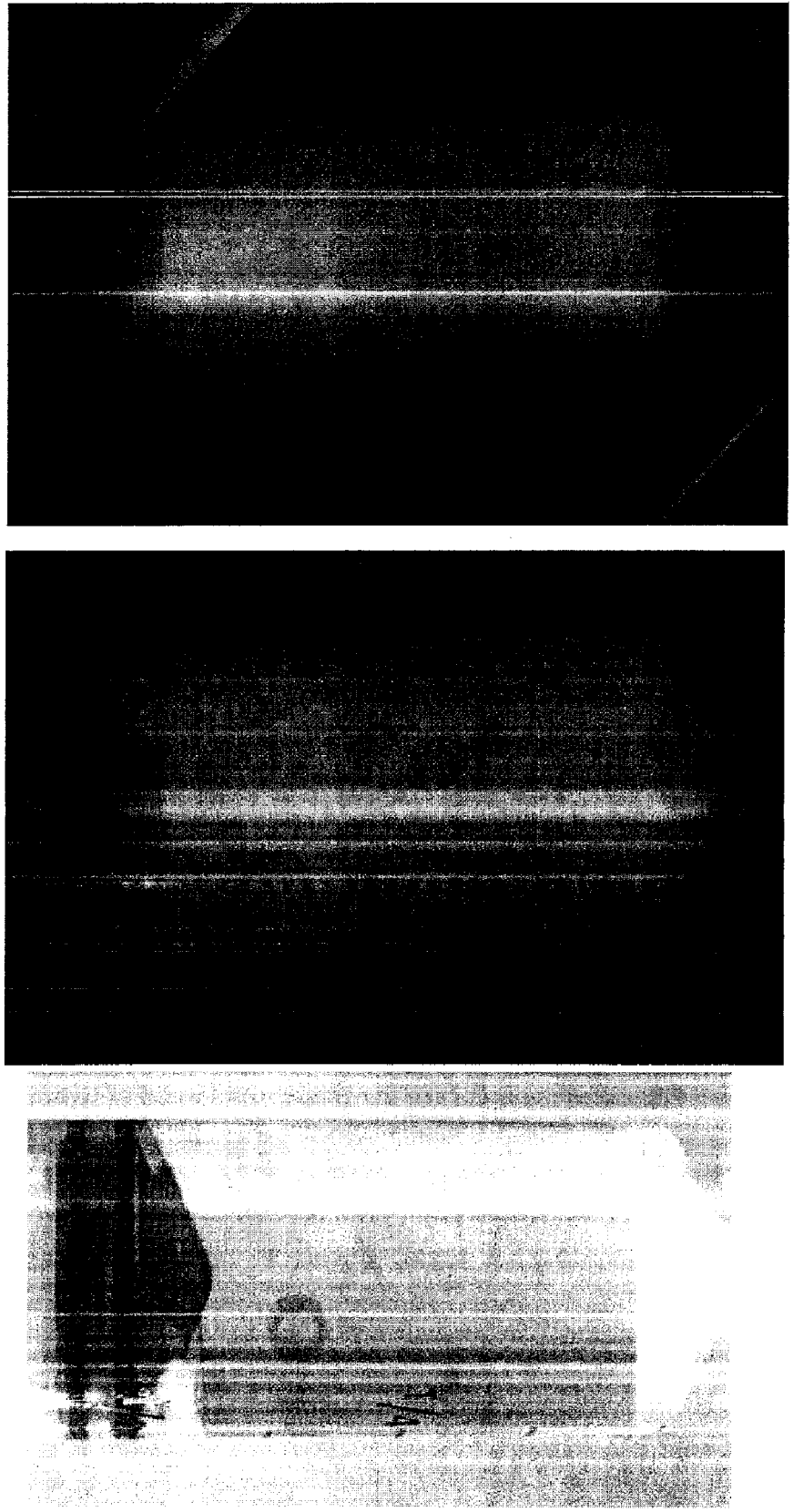
FIG. 7e shows a 2D MRI image of a phantom produced using the coil array of FIG. 7c.

FIG. 7e is a 2D image obtained using the Tx array coil shown in FIG. 7c. The experiment used the 0.2T static magnet and apparatus described above. The 2D k-space trajectories used were described in FIG. 6d. The Left Panel is a photograph of the phantom, a 25 mm diameter syringe, filled with tap water to 50 mm depth, having a conical plunger and bottom. The middle panel is an MRI image taken using conventional 2D spin-echo images (TE=18 ms, BW=10 kHz; single RF coil). The right panel is an MRI image taken using 2D TRASE method for k-space traversal (0.8 ms square refocusing pulses; 128 echoes, 5 ms echo spacing, BW=3.3 kHz (effective), acquired with gradient amplifiers powered down). Both MRI images were acquired as projections without slice selection, and with a TR relaxation time of 1 s. In both MRI images pixels (128×128 matrix) are averages of 4 measurements, and were acquired in 512 s. The excitation pulse is an 0.8 ms square excitation pulse.

The $k_A$ and $k_B$ fields were produced by a spiral birdcage pair (±1.25 deg/mm) and the orthogonal $k_C$ field by a combination crossed Helmholtz-Maxwell coil (1.2 deg/mm). The general procedure for a P×R acquisition matrix is to use P/2 shots with refocusing pulses $C\text{-}(AC)_i\text{-}(AB)_{R/2}$, and P/2 shots of $C\text{-}(AC)_i\text{-}(BA)_{R/2}$, where i=0 . . . P/2-1, and finally a single shot of $(AB)_{R/2}$. The images from the two techniques are very similar (both showing the conical base and plunger) and so validate the TRASE approach. Acquisition was with one of the fields.

FIG. 8a is a schematic illustration of a 6-element array for producing a B1 field of constant amplitude and linear phase distribution in the z-direction of the sample volume, upon energization by controlled, selected RF pulses delivered to each element so that a controlled phase distribution can be achieved. The 6-element array consists of three pairs of elements, the paired elements are loops parallel that oppose each other (concentrically) with the sample volume in between. Each of the pairs (Helmholtz pairs) has coils that are driven so that the electrical current flows in a same direction as each other (co-rotating coils).

One of the pairs, the large pair is concentric with the x-axis. The other 2-pairs (two small pairs) have axes parallel with (above and below) the y-axis and are equally spaced from the y axis. The two elements of the small pairs in the positive z direction are coplanar, and non-overlapping as are the two elements of the small pairs in the negative z direction. The 4 elements of the small pairs are driven so that the electrical current flows in the same direction (co-rotating) as the opposite element, and opposite direction (counter-rotating coils) to the coil element coplanar with it. Accordingly the elements of each pair is co-rotating, but the small pairs are counter-rotating.

In the embodiment produced, the small pairs have 2-turns whereas the large pair has 1-turn, such that for equal power splitting to each pair, the B1-field magnitude from the small pairs will be approximately two times stronger, which when combined with the large pair B1-field will produce a substantially uniform amplitude phase gradient field, as schematically illustrated.

It will be appreciated that three different sets of RF pulses could be delivered to the respective pairs, the RF pulses having amplitude, phase and waveform selected so that a particular phase distribution can be achieved, and further that 6 different RF pulses could be supplied to each coil. This would allow the same coils to be used for both x and y encoding and for encoding 0 phase gradient fields.

FIG. 8b shows two photographs of a 3D Tx-array coil for 3D imaging containing 4 large loops for producing 2 large pairs (co-rotating) B1 fields in either x- or y-direction, and orthogonal Maxwell (counter-rotating) B1 fields in either x- or y-direction, when energized in parallel using (in this case a single transmitter with a power splitter) produces a phase gradient in the x- or y-direction. Also, 4 small 2-turn loops for producing a y-directed dipole B1 field in the z-direction (see FIG. 8a), when with a large Helmholtz field, is energized in parallel using (in this case a single transmitter with a power splitter), creates a phase gradient in the z-direction. A zero phase gradient (referred to as a uniform field) is also achieved by energizing only the co-rotating current Helmholtz field portion of the array as shown in FIG. 8a, using in addition a fifth large central loop to improve signal-to-noise and uniformity of the uniform field.

Figure 8C:
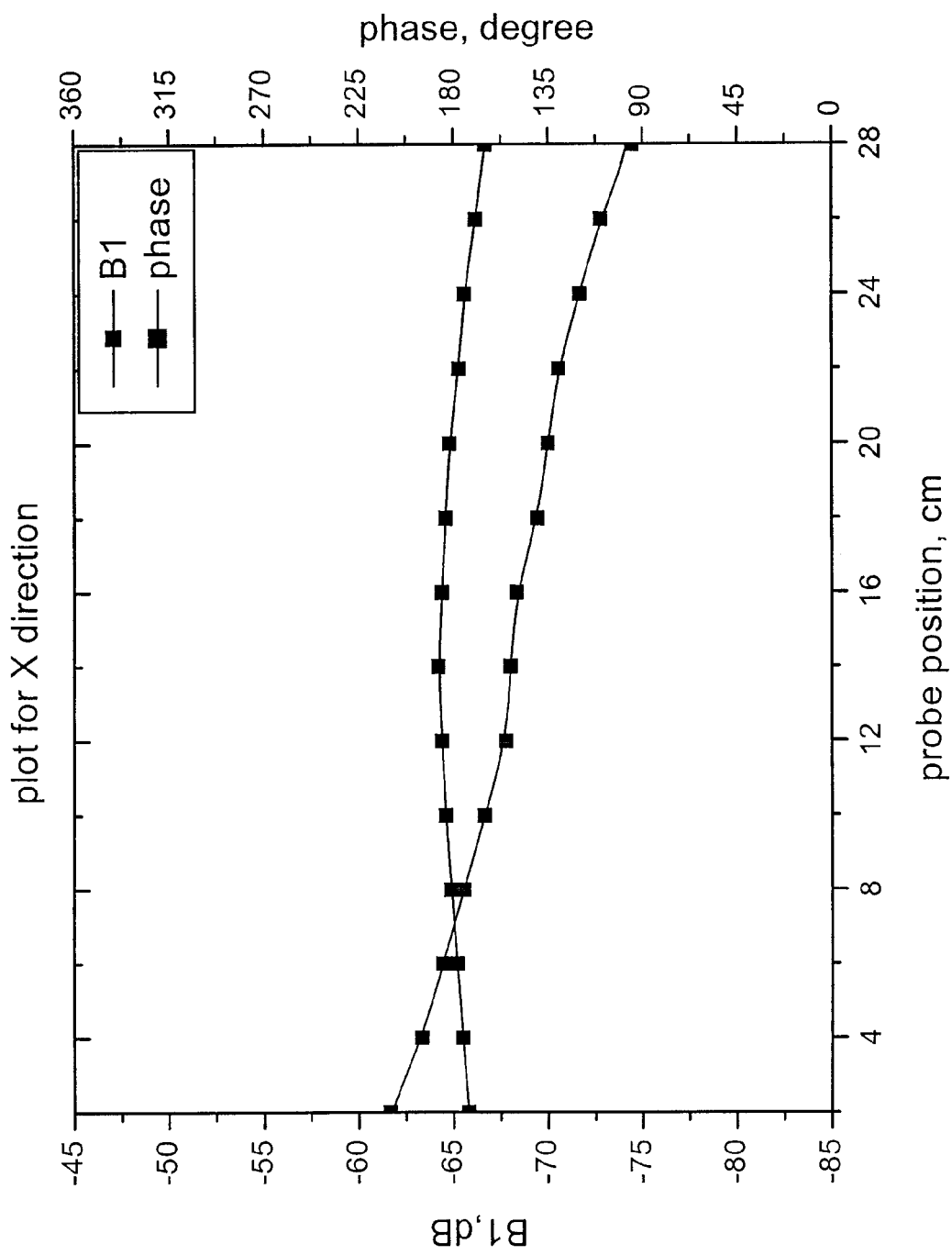

FIGS. 8c-e are plots of the phase gradients and amplitude gradients produced by the 3D Tx-array coil shown in FIG. 8b. In all cases the substantially concave down plots (lower at the right hand side except in FIG. 8c) are the amplitude gradients measured in dB (left hand axes), and the plots higher at the right hand side (except in FIG. 8c) correspond to the phase gradient. It is noted that substantially linear phase gradients are produced across the full distance and the gradients span about 85° (±15°). The amplitude gradient varies within 10-15% over this range.

The foregoing examples have provided k-space walks (refocusing pulse trains) for acquisition, as shown in FIG. 2a,b. Two other types of refocusing pulse trains are equally applicable to this method of k-space traversal: encoding, and spatial selection.

Encoding Type Train

The encoding-type train consists of a series of refocusing pulses using at least two B1 fields. There is no collection of echo data and also no extra RF pulses placed in-between the refocusing pulses. The effect of this sequence upon an excited spin system is to move the state of the spin system in k-space. The effect is thus just to move though k-space. Removal of acquisition windows or small flip angle pulses from an acquisition type train or an excitation type train, respectively, provides an example of an encoding pulse train.

Selective Excitation Type Train

Selective excitation pulse trains are sequences of refocusing pulses with additional pulses placed between the refocusing pulses. Typically these extra pulses will individually be of low flip angle, and are used to deposit energy in a k-space weighting function that follows the refocusing pulses. The k-space traversal can be used for encoding, or during readout as described above, or for excitation. Further details of excitation are explained in applicants co-pending application filed on May 2, 2008, entitled: RF BASED SPATIALLY SELECTIVE EXCITATION IN MRI.

FIGS. 9a-f shows a simulation of the slice-selective excitation method for a 1D example.

FIG. 9a shows the pulse sequence schematically with the repeated pattern of: [Low-Flip-Angle-Pulse1—Refocusing Pulse A—Low-Flip-Angle-Pulse2—Refocusing Pulse B—etc.]. The truncated pulse sequence consists of alternating $B1_a$ and $B1_b$ refocusing pulses interspersed by one small flip angle pulse in each interval. The small flip angle pulse is produced using a uniform (null) gradient field.

FIG. 9b is a table listing in detail a pulse sequence used for simulation of the excitation process shown in FIG. 5b. It contains 29 interleaved small flip angle pulses 10 and 14 pairs of 180 degree refocusing pulses 3,4 (pulses 1-57) and is followed by a series of 7 pairs of alternating refocusing pulses 58-71 only (using the reversed pattern—BA) to recenter the k-space weighting function on the origin, which causes rephasing across the excited slice. It will be noted that the small flip angle pulses at each point have different amplitudes and signs to modulate the energy deposited on the k-space weighting function to approximate with these discrete points a sin c waveform. Additionally it is necessary to invert the phase of alternate small-flip-angle pulses due to the phase-reversal effect of the 180 degree pulses.

Figure 9C:
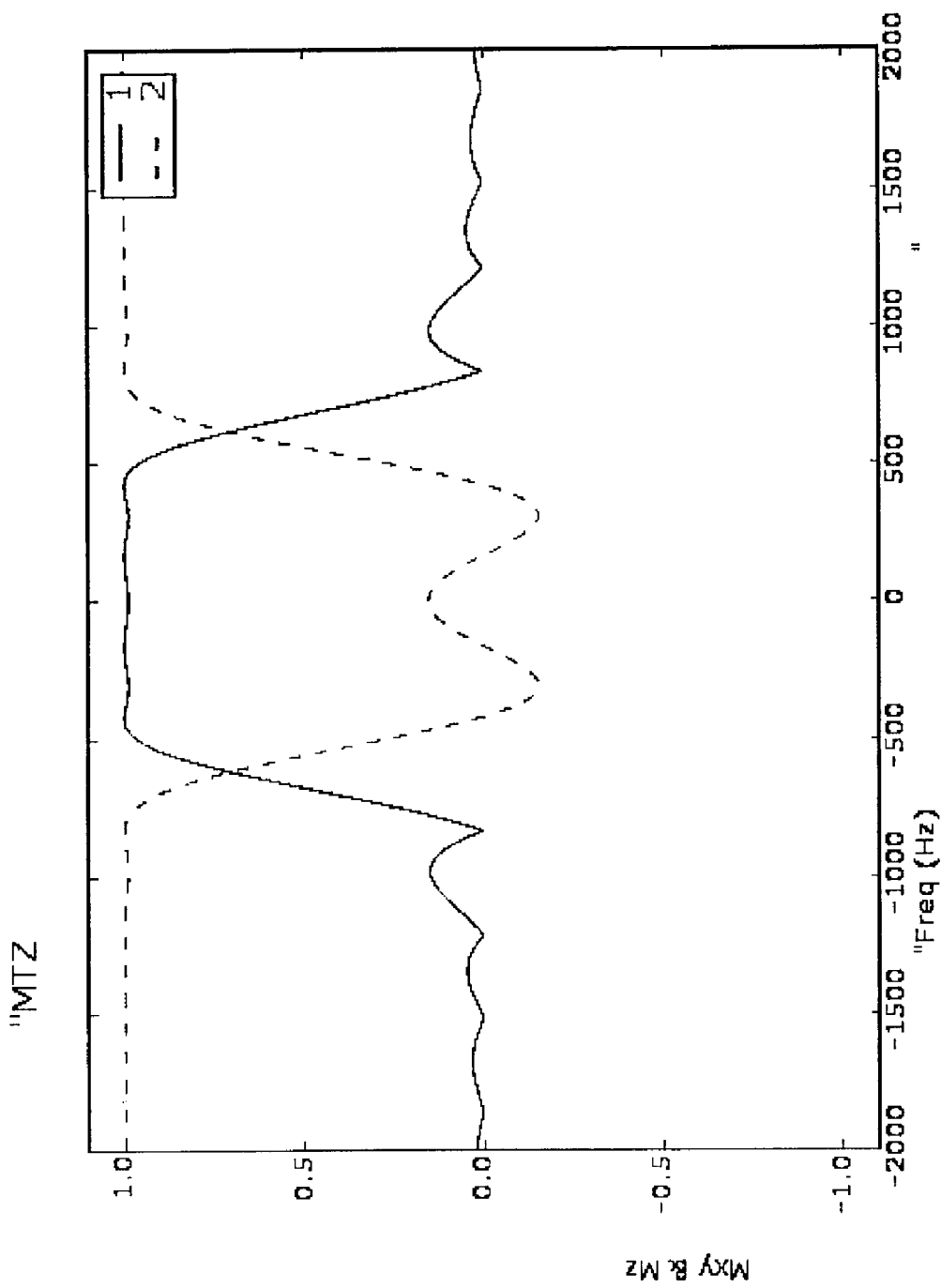
FIG. 9c shows a target (design) profile for slice selection.

FIG. 9c shows a target (design) profile for slice selection. This is approximately the Fourier transform of the excitation envelope. A slice profile and slice shift is thus selected by selecting the shape of the waveform (i.e. the amplitude and phases of the small flip angle pulses). The Fourier transform of the sin c (sin(x)/x) function being a rectangular function. The width of the sin c waveform is inversely proportional to the slice width.

In all plots labelled 'MTZ', Trace 1 is the magnitude of the transverse magnetization (Mxy), and Trace 2 is the longitudinal magnetization (Mz).

Figure 9D:
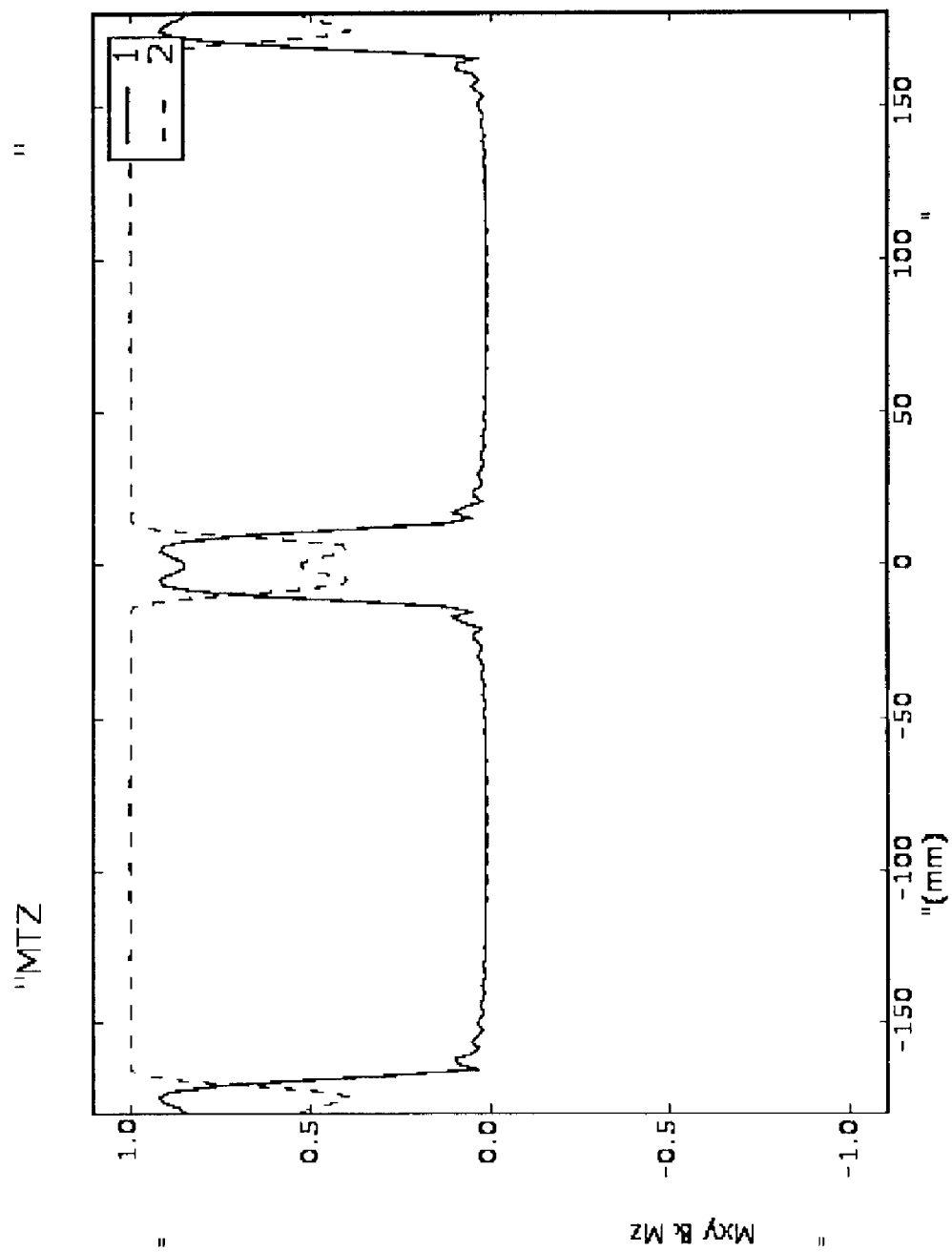
FIG. 9d shows the simulated profile slice-selection.

FIG. 9d shows the simulated slice-selection results. This is similar, (but not quite identical) to the target response indicating that the approach is successful. Aliasing is also visible as extra slices excited at the edge of the FIG. 9d.

FIG. 9d shows the simulated slice-selection results. This is similar, (but not quite identical) to the target response indicating that the approach is successful. Aliasing is also visible as extra slices excited at the edge of the FIG. 9d.

FIG. 9e shows simulated slice selection results with slice shift. The target profile was modified by multiplication with a complex phase shift function to shift its Fourier response (i.e. in the frequency domain) by 3000 Hz. This corresponds to a slice shift and note that the slice profile does indeed shift as expected. Note also that aliased slice moves together with the central slice. In plots labelled 'FP', Trace 1 is the flip angle achieved, and Trace 2 is the phase.

FIG. 9f shows results of the same experiment except that a composite refocusing pulse (90x-180y-90x) was used in placing of the simple square refocusing pulse. The result shows that the performance is improved.

Many shaped radiofrequency pulse types can be implemented by this method (Bernstein 2004, Chapter 2). These pulse shapes include Rectangular Pulses, Sinc Pulses, Gaussian pulses, SLR pulses, and Variable Rate pulses. They also include all pulse types: excitation, inversion, refocusing (Bernstein 2004, Chapter 3). This also includes spatial radiofrequency pulses (Bernstein chapter 5), including multidimensional pulses, Ramp (TONE) pulses, spatial saturation pulses, and tagging pulses. This also includes adiabatic excitation, inversion and refocusing pulses (Bernstein Chapter 6).

All the methods described for selection of a 1D slice have the analogous 2D and 3D equivalents. For the 2D case this involves moving through 2D k-space and thus the RF energy for the soft pulse is deposited across the area of a plane of k-space in a specified pattern. This allows the selection of a 2D shape, such as a disk. The analogous 3D experiment results in selection of a 3D shape, such as a sphere.

Methods to Reduce or Eliminate Effects of Aliasing in Slice-Selection

Both the B1a and B1b fields have a phase difference between opposite sides of a field of view (FOV) in the sample volume. This phase difference is termed a total phase change over the FOV. If the difference between the total phase change of B1a and B1b is at most pi, the object in the sample volume can be spatially encoded in a single shot without correction for aliasing effects, as indicated by the FOV per shot ($FOV_{shot}$). Aliasing is a well known phenomenon resulting in image artifacts. Slice selection using phase gradients that have a difference greater than pi can result in aliasing (see FIGS. 11e,f,g)—that is additional unwanted selected slices. There are a number of approaches that can be used to avoid or eliminate this aliasing while using larger than pi differences in total phase change between $B1_a$ and $B1_b$.

One method of anti-aliasing uses two echo trains (also known as a "shot"), with only two different Tx (B1) phase gradient fields $B1_a$ and $B1_b$ which exhibit a phase twist difference of Phi over a length X. Complete k-space traversal is possible in the direction of this phase difference, by applying refocusing pulses successively with each of the two B1 fields such as: (for 1-D)

---

1. (A excitation) ABAB ... ($90^1$)-$180^1$-$180^2$-$180^1$-$180^2$ or,
2. (B excitation) BABA ... ($90^2$)-$180^2$-$180^1$-$180^2$-$180^1$ ...

--- where the small flip angle pulses can be applied with either coil, but works nicely if the (90 degree) total excitation is done with the same coil as the first (180 degree) refocusing pulse. By applying the pulse sequence given in (1.) above, then applying pulse sequence (2.) above, and combining the data together, the FOV (after $2^{nd}$ shot) will be twice that of applying only one of the two pulse sequences.

Spatial resolution using TRASE is limited by a difference between the two phase gradients (G1) used to step through k-space, and the number of echoes that are collected in a single shot, and therefore ultimately by the effective transverse decay rate of the transverse magnetization. Also, the FOV is also limited by G1, so wrapping artifacts would be seen if additional k-space points are not collected (using multiple shots with a shifted k-space traversal grid) or calculated (half-Fourier). Therefore, it is expected that parallel imaging could be used to remove wrapping artifacts or increasing reconstructed spatial resolution.

Although TRASE is a new method, the end result is a k-space weighting function, so improvements to unwrapping and resolution using parallel imaging is not altered if the k-space data is acquired using TRASE rather than traditional k-space data collection methods using magnetic field gradients. This is because parallel MRI methods operate on the received data using array element sensitivity information of the phased array used for reception, which in general is different from the Tx-array used for TRASE MRI k-space traversal.

In another method for anti-aliasing, the region where aliasing is liable to occur can be saturated (e.g. a 90 degree pulse is previously applied to affect this region), so that there is no remaining NMR signal.

In a further approach the excitation coil field can be arranged so as not to excite the regions vulnerable to aliasing.

This can be achieved by using a sufficiently small emitter coil. A restricted extent of excitation coil could be used to avoid exciting aliased responses.

Yet another approach is the use of a restricted extent of Rx coil avoids detection of aliased responses. This is the use of a receiver coil that is small enough so that it does not detect the signal from the aliased slices.

In yet another approach, multiple receive coils used in a parallel imaging mode (Top Magn. Reson. Imaging 2004; 15:223-236, M Blaimer, F Breuer, M Mueller, Robin M. Heidemann, M A. Griswold, and Peter M. Jakob, SMASH, SENSE, PILS, GRAPPA) can be used to distinguish and hence separate out the signals from the aliased slices.

FIG. 10 shows a field having a uniform amplitude and non-linear phase distribution. The top left hand graph shows a two phase distributions of symmetric B1 fields that have substantially linear segments within a middle section and attenuated phase distributions at the ends where it approaches a null phase gradient. This is shown for one of the B1 fields in the lower graph. The second field would look like the same trapezoid reflected about the x axis. When these B1 fields are alternated in a TRASE simulation, the center of the sample volume which is exposed to the linear sections of the phase gradients will operate as if the coils are linear phase gradient coils, but parts of the sample volume where the phase gradients are weaker will not be moved in k-space to the same degree and thus less coherent phase accumulation will occur in these parts. Given the durations it is generally safe to assume that there is little motion of the dipoles between these regions. At each iteration of the refocusing, the same fraction of the sample volume will be exposed to the different effective phase gradient steps and accordingly the difference in k-space position of the segments of the sample volume will diverge increasingly.

Slice selection is a useful mechanism for illustrating the effect of using a set of B1 fields having non-linear phase gradients that don't have a linear phase difference. The simulation output shown at the right of FIG. 10 demonstrates that near a center of the sample volume the selected slice bears an intensity and definition consistent with other examples, and that the lower image of a slice selected at a position substantially at the edge of the linear part of the phase distribution already shows a marked blurring caused by the differentiated effect of small flip angle pulses using these fields.

FIG. 11 shows a complementary phase distribution that could be used in place of linearly varying phase B1 fields to achieve equivalent results. As the first derivatives of the phase as a function of position of the complementary B1 fields are the same, application of one followed by the other of the complementary B1 fields (within the static field) a uniform k-space step is produced at all points in the sample volume.

An odd number of the applications of these two B1 fields will produce a distributed k-space where all of the points will be bifurcated within the sample volume, In one region of the sample volume, the points will be effectively flipped over the k-space focus associated with the slope of the first line segment and the remainder of the sample volume will be flipped over the k-space focus of the slope of the second line segment. The subsequent application of the other B1 field will see the bifurcated points rejoined. The diagram shows how a linear phase difference between 2 fields along 1 axis can be produced without the individual fields being of uniform phase.

While this is shown with phase distributions having a singular discontinuity, it will be appreciated that 2 or more discontinuities that also match spatially within the sample volume between the two coils are equally contemplated. Furthermore the pairs of smoothly varying phase as a function of distance that have first derivatives that sum to a linear function can equally be used.

A method has been provided for k-space traversal using only phase gradient coils, for encoding, acquisition and spatial selection type pulse trains, in one two or three dimensions. While it will be appreciated that the foregoing examples all provide either two B1 fields or three B1 fields, in each case the k-space foci of the B1 fields are collinear and the line passing through the k-space foci also pass through the origin of k-space. It is natural that once a phase gradient of uniform amplitude and constant phase gradient is identified, that it would be used along with its twin (an oppositely directed phase gradient) to permit the highest phase gradient step, this is not essential. When only the two linear phase gradient B1 fields are used, each refocusing step moves the k-space weighting function out one step or in one step. When the uniform amplitude field is used as well, at each point there are three options: flip the k-space weighting function about the origin, or about the positive or negative k-space foci. As each of these takes the k-space weighting function to an integer multiple of length A (the distance from the origin to the k-space focus of $B1_a$) although you can switch the fields used to advance, there is no way to improve a FOV by moving the k-space weighting function to present points intermediate the A length steps. By selecting three fields that are not equally spaced, more options are provided for the sizes of steps and different trade-offs between FOV and resolution can be made by using different refocusing trains.

Other advantages that are inherent to the structure are obvious to one skilled in the art. The embodiments are described herein illustratively and are not meant to limit the scope of the invention as claimed. Variations of the foregoing embodiments will be evident to a person of ordinary skill and are intended by the inventor to be encompassed by the following claims.

The invention claimed is:

1. A method of k-space traversal in an MRI procedure using a static magnet without the need for gradient field coils, comprising:

providing an RF transmitter array that is operable to produce two fields (B1a,B1b), both of which having a substantially uniform amplitude over a sample volume, and each having a spatial phase distribution along a first coordinate direction of the sample volume such that a difference between vector spatial derivatives (G1a,G1b, respectively) of the spatial phase distributions of B1a and B1b defines a gradient difference field G1;

applying a pulse sequence to the RF transmitter array within one transverse relaxation period (T2), the pulse sequence including at least three iterations of refocusing pulses applying B1a and B1b in alternation, whereby accumulated spin magnetization phase from previous applications of B1a and B1b permits the uniform stepping through k-space with each iteration of the alternating refocusing pulses.

2. The method of claim 1 wherein applying the pulse sequence comprises applying the at least three iterations of alternating refocusing pulses which are separated by at most one of: one or more small flip angle excitation pulses, and one or more acquisition windows between each of the refocusing pulses.

3. The method of claim 2 wherein providing an RF transmitter array comprises providing the RF transmitter array operable to produce B1a and B1b having the spatial phase distribution in the first coordinate direction along one of a coordinate axis, a radial coordinate direction, and an azimuthal coordinate direction.

4. The method of claim 2 wherein applying the pulse sequence comprises applying at least one excitation pulse followed by iterations of the alternating refocusing pulses interrupted only by an acquisition window between at least some of the refocusing pulses, to effect a sampling of the MRI signal during traversal through receive k-space.

5. The method of claim 2 wherein applying the pulse sequence comprises applying at least one excitation pulse followed by iterations of the alternating refocusing pulses interrupted only by small flip angle excitation pulses between at least some of the refocusing pulses, to effect a spatially selective excitation by traversal through excitation k-space.

6. The method of claim 2 wherein applying the pulse sequence comprises applying a pulse sequence having more than 7 iterations of the alternating refocusing pulses.

7. The method of claim 2 wherein applying the pulse sequence comprises applying a pulse sequence having a number of iterations of refocusing pulses N that is directly proportional to an image spatial resolution.

8. The method of claim 2 wherein providing the RF transmitter array comprises providing the RF transmitter array that is operable to produce B1a and B1b fields where a difference between the total phase change over a field of view of the B1a and B1b fields is at most $\pi$, whereby no compensation for aliasing is required by image analysis.

9. The method of claim 2 wherein providing the RF transmitter array comprises providing the RF transmitter array that is operable to produce B1a and B1b fields where a difference between the total phase change over a field of view of the B1a and B1b fields exceeds $\pi$, and anti-aliasing techniques are used to compensate for resulting wrapping in the image domain.

10. The method of claim 2 wherein providing the RF transmitter array comprises providing the RF transmitter array that is operable to produce at least one of the B1a and B1b fields with a phase that varies substantially linearly along the first coordinate direction within the sample volume.

11. The method of claim 2 wherein providing the RF transmitter array comprises providing the RF transmitter array that is operable to produce both of the B1a and B1b fields having phases that vary substantially linearly along the first coordinate direction within the sample volume, and the Fourier image transform kernel is applicable.

12. The method of claim 2 wherein:
the k-space traversal has at least two dimensions;
the RF transmitter array is further operable to provide a third B1 field (B1c) that is substantially of uniform amplitude throughout the sample space and has a continuous spatial phase distribution along a second coordinate direction, the first and second coordinate directions spanning a surface within the sample space; and
applying the pulse sequence to the RF transmitter array includes applying at least three iterations of refocusing pulses generating B1c and one of B1a and B1b in alternation to step through k-space in a direction associated with the second axis.

13. The method of claim 12 wherein providing the RF transmitter array comprises providing the RF transmitter array that is operable to produce the B1b field that is substantially constant in phase along the second coordinate direction, and to produce the B1c field that is substantially constant in phase along the first coordinate direction, the first and second coordinate directions being orthogonal.

14. The method of claim 12 wherein:
the k-space traversal has at least three dimensions;
the RF transmitter array is further operable to provide a fourth B1 field (B1d) that is substantially of uniform amplitude throughout the sample space and has a continuous spatial phase distribution along a third coordinate direction, the first, second and third coordinate directions spanning the sample volume; and
applying the pulse sequence to the RF transmitter array includes applying at least three iterations of refocusing pulses generating B1d and one of B1a, B1b and B1c in alternation to step through k-space in a direction associated with the third coordinate direction.

15. The method of claim 14 wherein the RF transmitter array is operable to provide B1d that has a continuous spatial phase distribution along the first and second coordinate directions, which are orthogonal to the third coordinate direction.

16. The method of claim 14 wherein providing the RF transmitter array comprises providing the RF transmitter array that is operable to produce the B1a field that is substantially constant in phase along the first, second and third coordinate directions.

17. The method of claim 16 wherein providing the RF transmitter array comprises providing the RF transmitter array that is operable to produce:
the B1b field that has a continuous spatial phase distribution along the second and third coordinate directions,
the B1c field that has a continuous spatial phase distribution along the first and third coordinate directions, and
the B1d field that has a continuous spatial phase distribution along the second and third axes.

18. The method of claim 17 wherein providing the RF transmitter array comprises providing the RF transmitter array that is operable to produce the B1a, B1b, B1c, B1d with the first, second and third coordinate directions being three axes of a Cartesian coordinate system.

19. The method of claim 2 wherein providing the RF transmitter array comprises providing the RF transmitter array that is operable to produce the B1a field that is substantially constant in phase over the first and second coordinate directions within the sample volume.

20. The method of claim 2 wherein providing the RF transmitter array comprises providing one array having a plurality of voltage connectors for being driven by RF pulses, including the refocusing pulses.

21. The method of claim 2 wherein providing the RF transmitter array comprises providing a first element for producing the B1a field that has a constant phase and amplitude across the sample volume, and a second element producing the B1b field.

22. The method of claim 2 further comprising applying a second pulse sequence to the RF transmitter array within a subsequent transverse relaxation period (T2), the second pulse sequence having a different excitation prior to the at least three iterations of refocusing pulses applying B1a and B1b in alternation, wherein uniform stepping through k-space starting from a different origin is performed to provide a second walk through the k-space having points intermediate the points of the first walk, whereby in two shots a higher density of points are produced.

* * * * *